(12) United States Patent
Mane et al.

(10) Patent No.: US 11,326,255 B2
(45) Date of Patent: May 10, 2022

(54) ALD REACTOR FOR COATING POROUS SUBSTRATES

(71) Applicant: UChicago Argonne LLC, Argonne, IL (US)

(72) Inventors: Anil U. Mane, Downers Grove, IL (US); Joseph Libera, Clarendon Hills, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 298 days.

(21) Appl. No.: 14/175,396

(22) Filed: Feb. 7, 2014

(65) Prior Publication Data

US 2014/0220244 A1 Aug. 7, 2014

Related U.S. Application Data

(60) Provisional application No. 61/761,988, filed on Feb. 7, 2013.

(51) Int. Cl.
| | |
|---|---|
| *C23C 16/455* | (2006.01) |
| *H01J 43/24* | (2006.01) |
| *C04B 38/00* | (2006.01) |
| *C23C 16/04* | (2006.01) |

(52) U.S. Cl.
CPC .... *C23C 16/45565* (2013.01); *C04B 38/0096* (2013.01); *C23C 16/045* (2013.01); *C23C 16/45544* (2013.01); *H01J 43/246* (2013.01); *H01J 2231/5016* (2013.01)

(58) Field of Classification Search
None
See application file for complete search history.

(56) References Cited

U.S. PATENT DOCUMENTS

| | | | | | |
|---|---|---|---|---|---|
| 3,233,014 | A | * | 2/1966 | Bickerdike | C04B 35/83 264/29.1 |
| 3,238,054 | A | * | 3/1966 | Bickerdike | C04B 35/83 201/21 |
| 3,369,920 | A | * | 2/1968 | Bourdeau | C04B 35/522 264/29.2 |
| 3,520,667 | A | * | 7/1970 | Taylor | C09K 3/1445 427/215 |

(Continued)

FOREIGN PATENT DOCUMENTS

| | | | | |
|---|---|---|---|---|
| EP | 0256073 B1 | * | 9/1990 | ............. C23C 16/00 |
| FI | WO 2013140021 A1 | * | 9/2013 | ....... C23C 16/45527 |

(Continued)

OTHER PUBLICATIONS

"Anopore® Inorganic Membranes" in Whatman® Product Catalog. 2009. pp. 67-69. Whatman PLC, United Kingdom. (Year: 2009).*
Mikko Ritala, et al. "Rapid Coating of Through-Porous Substrates by Atomic Layer Deposition." Chem. Vap. Deposition. 12 (2006). pp. 655-658. (Year: 2006).*

(Continued)

*Primary Examiner* — Jeffrie R Lund
*Assistant Examiner* — Stanislav Antolin
(74) *Attorney, Agent, or Firm* — Foley & Lardner LLP

(57) ABSTRACT

A system and method for improved atomic layer deposition. The system includes a top showerhead plate, a substrate and a bottom showerhead plate. The substrate includes a porous microchannel plate and a substrate holder is positioned in the system to insure flow-through of the gas precursor.

14 Claims, 27 Drawing Sheets

(56) References Cited

U.S. PATENT DOCUMENTS

| | | | | |
|---|---|---|---|---|
| 3,537,426 A * | 11/1970 | Smith | B05C 19/025 | |
| | | | 118/309 | |
| 3,673,051 A * | 6/1972 | Clark | C04B 35/522 | |
| | | | 428/195.1 | |
| 3,673,457 A | 6/1972 | Sackinger et al. | | |
| 3,739,216 A * | 6/1973 | Pakswer | H01J 43/20 | |
| | | | 313/105 CM | |
| 3,895,084 A * | 7/1975 | Bauer | C04B 35/806 | |
| | | | 156/89.26 | |
| 3,991,248 A * | 11/1976 | Bauer | C04B 35/806 | |
| | | | 442/148 | |
| 4,051,403 A | 9/1977 | Feingold et al. | | |
| 4,341,592 A * | 7/1982 | Shortes | H01L 21/31138 | |
| | | | 134/2 | |
| 4,569,805 A * | 2/1986 | Hume | B01F 3/04262 | |
| | | | 261/122.1 | |
| 4,625,106 A | 11/1986 | Bender et al. | | |
| 4,757,229 A | 7/1988 | Schmidt et al. | | |
| 4,823,734 A * | 4/1989 | Christin | C04B 41/4505 | |
| | | | 118/715 | |
| 4,853,020 A * | 8/1989 | Sink | B01L 3/50857 | |
| | | | 65/393 | |
| 4,894,160 A * | 1/1990 | Abe | B01D 46/2422 | |
| | | | 210/510.1 | |
| 4,912,314 A * | 3/1990 | Sink | B01L 3/50857 | |
| | | | 250/207 | |
| 4,963,393 A * | 10/1990 | Goela | C23C 16/042 | |
| | | | 118/504 | |
| 5,039,357 A * | 8/1991 | Epler | C21D 9/10 | |
| | | | 148/209 | |
| 5,048,807 A * | 9/1991 | Martinez | C04B 35/806 | |
| | | | 269/243 | |
| 5,068,634 A | 11/1991 | Shrier | | |
| 5,086,248 A | 2/1992 | Horton et al. | | |
| 5,126,249 A | 6/1992 | Becker et al. | | |
| 5,141,775 A * | 8/1992 | Patrigeon | C04B 35/80 | |
| | | | 156/242 | |
| 5,154,948 A * | 10/1992 | Patrigeon | C04B 35/80 | |
| | | | 156/289 | |
| 5,160,544 A * | 11/1992 | Garg | C23C 16/271 | |
| | | | 118/724 | |
| 5,177,878 A * | 1/1993 | Visser | C23C 14/50 | |
| | | | 165/80.1 | |
| 5,202,158 A * | 4/1993 | Sakagami | C04B 35/80 | |
| | | | 118/715 | |
| 5,216,249 A | 6/1993 | Jones et al. | | |
| 5,334,840 A * | 8/1994 | Newacheck | G01T 3/00 | |
| | | | 250/390.01 | |
| 5,350,480 A * | 9/1994 | Gray | H01L 21/02071 | |
| | | | 134/31 | |
| 5,378,960 A * | 1/1995 | Tasker | H01J 9/12 | |
| | | | 313/103 CM | |
| 5,402,034 A | 3/1995 | Blouch et al. | | |
| 5,472,650 A * | 12/1995 | Johnson | C04B 35/64 | |
| | | | 264/432 | |
| 5,480,678 A * | 1/1996 | Rudolph | C04B 35/83 | |
| | | | 118/715 | |
| 5,529,950 A * | 6/1996 | Hoenlein | H01L 21/76898 | |
| | | | 438/107 | |
| 5,726,076 A | 3/1998 | Tasker et al. | | |
| 5,738,908 A * | 4/1998 | Rey | C04B 35/565 | |
| | | | 427/249.2 | |
| 5,820,686 A * | 10/1998 | Moore | C23C 16/4581 | |
| | | | 118/730 | |
| 5,904,957 A * | 5/1999 | Christin | C23C 16/045 | |
| | | | 427/248.1 | |
| 5,914,278 A * | 6/1999 | Boitnott | H01L 21/67017 | |
| | | | 156/345.29 | |
| 5,916,633 A * | 6/1999 | Lackey | C04B 35/83 | |
| | | | 427/228 | |
| 5,945,177 A * | 8/1999 | Hack | C23C 16/455 | |
| | | | 427/109 | |
| 5,964,320 A * | 10/1999 | Kato | B66B 5/22 | |
| | | | 187/375 | |
| 5,997,713 A * | 12/1999 | Beetz, Jr. | B81B 1/004 | |
| | | | 205/124 | |
| 6,197,374 B1 * | 3/2001 | Huttinger | C04B 41/4531 | |
| | | | 427/249.15 | |
| 6,200,893 B1 | 3/2001 | Sneh | | |
| 6,300,640 B1 * | 10/2001 | Bhargava | G01T 1/20 | |
| | | | 250/361 R | |
| 6,311,001 B1 * | 10/2001 | Rosine | C03B 37/028 | |
| | | | 385/120 | |
| 6,420,279 B1 | 7/2002 | Ono et al. | | |
| 6,479,826 B1 | 11/2002 | Klann et al. | | |
| 6,495,837 B2 | 12/2002 | Odom et al. | | |
| 6,503,330 B1 | 1/2003 | Sneh et al. | | |
| 6,545,281 B1 | 4/2003 | McGregor et al. | | |
| 6,572,371 B1 * | 6/2003 | Sion | C23C 16/045 | |
| | | | 118/724 | |
| 6,585,823 B1 | 7/2003 | Van Wijck | | |
| 6,613,383 B1 * | 9/2003 | George | B01J 2/006 | |
| | | | 427/212 | |
| 6,669,988 B2 * | 12/2003 | Daws | C23C 16/045 | |
| | | | 427/249.2 | |
| 6,713,177 B2 * | 3/2004 | George | B01J 2/006 | |
| | | | 257/E23.107 | |
| 6,876,711 B2 | 4/2005 | Wallace et al. | | |
| 6,913,827 B2 * | 7/2005 | George | B01J 2/006 | |
| | | | 257/E23.107 | |
| 7,164,138 B2 | 1/2007 | McGregor et al. | | |
| 7,233,007 B2 | 6/2007 | Downing et al. | | |
| 7,335,594 B1 | 2/2008 | Wang et al. | | |
| 7,557,229 B2 | 7/2009 | Gordon et al. | | |
| 7,595,270 B2 | 9/2009 | Elers et al. | | |
| 7,759,138 B2 | 7/2010 | Beaulieu et al. | | |
| 7,842,214 B2 * | 11/2010 | Romdhane | B01D 67/0013 | |
| | | | 210/500.27 | |
| 7,892,646 B1 * | 2/2011 | Rudolph | C04B 41/89 | |
| | | | 428/292.1 | |
| 7,972,569 B2 | 7/2011 | Elam et al. | | |
| 7,977,617 B2 * | 7/2011 | Sullivan | G01T 3/08 | |
| | | | 376/154 | |
| 7,981,472 B2 | 7/2011 | Dalton et al. | | |
| 8,052,884 B2 | 11/2011 | Sullivan et al. | | |
| 8,101,480 B1 | 1/2012 | Kim et al. | | |
| 8,344,241 B1 * | 1/2013 | Vidu | B82Y 10/00 | |
| | | | 136/252 | |
| 8,404,878 B2 | 3/2013 | Pallem et al. | | |
| 8,604,440 B2 | 12/2013 | Frisch et al. | | |
| 8,969,823 B2 * | 3/2015 | Elam | H01J 43/246 | |
| | | | 250/390.01 | |
| 9,255,327 B2 | 2/2016 | Winter et al. | | |
| 9,263,689 B2 | 2/2016 | O'Carroll et al. | | |
| 9,382,615 B2 | 7/2016 | Mantymaki et al. | | |
| 9,704,900 B1 * | 7/2017 | Xia | H01L 27/14618 | |
| 10,497,530 B2 | 12/2019 | Feigelson et al. | | |
| 10,515,798 B2 | 12/2019 | Park et al. | | |
| 2001/0000104 A1 * | 4/2001 | Li | H01J 37/32165 | |
| | | | 216/67 | |
| 2001/0037761 A1 * | 11/2001 | Ries | C23C 16/0227 | |
| | | | 117/200 | |
| 2002/0021064 A1 * | 2/2002 | Devoe | C03B 37/01214 | |
| | | | 313/105 CM | |
| 2002/0042344 A1 * | 4/2002 | Kondo | B01J 35/0006 | |
| | | | 502/56 | |
| 2002/0067789 A1 * | 6/2002 | Wallace | G01T 3/08 | |
| | | | 376/154 | |
| 2002/0076491 A1 * | 6/2002 | Delperier | C04B 35/83 | |
| | | | 427/248.1 | |
| 2002/0088714 A1 * | 7/2002 | Motoi | H01J 43/246 | |
| | | | 205/118 | |
| 2003/0054149 A1 * | 3/2003 | Pan | C04B 41/89 | |
| | | | 428/292.1 | |
| 2003/0091788 A1 * | 5/2003 | Schroder | F16C 33/043 | |
| | | | 428/137 | |
| 2003/0118728 A1 * | 6/2003 | Sion | C04B 35/83 | |
| | | | 427/249.2 | |

(56) References Cited

U.S. PATENT DOCUMENTS

| | | | |
|---|---|---|---|
| 2003/0138560 A1* | 7/2003 | Zhao | H01L 21/67109 427/248.1 |
| 2003/0205203 A1* | 11/2003 | Sion | C04B 35/83 118/725 |
| 2004/0028813 A1* | 2/2004 | Thebault | C23C 14/046 427/249.15 |
| 2004/0045932 A1* | 3/2004 | Kochergin | G03F 7/70941 216/59 |
| 2004/0083967 A1* | 5/2004 | Yuda | C23C 16/45519 118/715 |
| 2004/0087168 A1* | 5/2004 | Granneman | C23C 16/45521 438/706 |
| 2004/0134879 A1* | 7/2004 | Kochergin | G02B 5/20 216/24 |
| 2004/0253377 A1* | 12/2004 | Bok | C23C 16/045 427/249.2 |
| 2004/0255843 A1* | 12/2004 | Yoshida | C23C 16/4405 117/89 |
| 2005/0082007 A1* | 4/2005 | Nguyen | H01J 37/321 156/345.51 |
| 2005/0133166 A1* | 6/2005 | Satitpunwaycha | H01J 37/321 156/345.51 |
| 2006/0046059 A1* | 3/2006 | Arico | C23C 16/045 428/408 |
| 2006/0062910 A1* | 3/2006 | Meiere | C23C 18/06 427/226 |
| 2006/0096911 A1* | 5/2006 | Brey | D04H 1/56 210/500.1 |
| 2006/0193979 A1 | 8/2006 | Meiere et al. | |
| 2006/0263525 A1* | 11/2006 | Sion | C23C 16/045 427/249.2 |
| 2007/0031609 A1* | 2/2007 | Kumar | C23C 16/509 427/569 |
| 2007/0131849 A1* | 6/2007 | Beaulieu | H01J 29/023 250/214 VT |
| 2007/0217119 A1* | 9/2007 | Johnson | H01L 21/6831 361/234 |
| 2007/0259130 A1* | 11/2007 | Von Kaenel | C23C 16/45565 427/569 |
| 2007/0264840 A1* | 11/2007 | Itatani | C23C 16/4412 438/758 |
| 2008/0066684 A1* | 3/2008 | Patalay | C23C 16/45521 118/728 |
| 2008/0069951 A1* | 3/2008 | Chacin | C23C 16/45521 427/248.1 |
| 2008/0093341 A1* | 4/2008 | Turlot | C23C 16/455 216/71 |
| 2008/0113097 A1* | 5/2008 | Mahajani | C23C 16/45534 427/255.37 |
| 2008/0124462 A1* | 5/2008 | Waghray | C04B 35/83 427/249.2 |
| 2008/0223795 A1* | 9/2008 | Bakajin | B01D 53/228 210/767 |
| 2008/0237919 A1* | 10/2008 | Liu | B01D 63/066 264/176.1 |
| 2008/0241503 A1* | 10/2008 | Romdhane | B01D 67/0013 428/315.9 |
| 2008/0286448 A1* | 11/2008 | Elam | C23C 16/407 427/109 |
| 2009/0137043 A1* | 5/2009 | Parsons | D06M 10/04 435/398 |
| 2009/0194233 A1* | 8/2009 | Tamura | C23C 16/4404 156/345.1 |
| 2009/0197014 A1* | 8/2009 | Wu | C23C 16/27 427/569 |
| 2009/0206057 A1* | 8/2009 | Huang | G03F 1/32 216/67 |
| 2009/0212680 A1* | 8/2009 | Tremsin | H01J 43/246 313/103 R |
| 2009/0215211 A1* | 8/2009 | Tremsin | H01J 43/246 438/34 |
| 2009/0277776 A1* | 11/2009 | Kono | B01D 67/009 204/164 |
| 2009/0315443 A1* | 12/2009 | Sullivan | H01J 43/04 313/103 CM |
| 2009/0324829 A1 | 12/2009 | Dalton et al. | |
| 2010/0044577 A1* | 2/2010 | Sullivan | G01T 3/08 250/390.01 |
| 2010/0068132 A1* | 3/2010 | Vencill | B01J 19/249 423/648.1 |
| 2010/0075131 A1* | 3/2010 | Etzel | B01D 39/1676 428/315.5 |
| 2010/0075445 A1* | 3/2010 | Beaulieu | H01J 31/507 438/20 |
| 2010/0075560 A1* | 3/2010 | Seshadri | C07K 1/34 442/327 |
| 2010/0080841 A1* | 4/2010 | Porbeni | D04H 1/42 424/445 |
| 2010/0093527 A1* | 4/2010 | Hasselmann | F17D 3/00 219/759 |
| 2010/0178468 A1* | 7/2010 | Jiang | B01D 67/0002 428/164 |
| 2010/0189900 A1* | 7/2010 | Dickey | C23C 16/45551 427/255.5 |
| 2011/0135842 A1 | 6/2011 | Faguet et al. | |
| 2011/0220802 A1* | 9/2011 | Frisch | G01T 1/2928 250/363.03 |
| 2011/0229838 A1* | 9/2011 | Kalgutkar | A61K 6/887 433/9 |
| 2011/0250354 A1* | 10/2011 | Pallem | C23C 16/45553 427/255.23 |
| 2011/0253046 A1 | 10/2011 | Dalton et al. | |
| 2011/0268624 A1* | 11/2011 | Chandler | C30B 25/12 117/85 |
| 2012/0000886 A1* | 1/2012 | Honda | H01J 37/18 216/24 |
| 2012/0070794 A1* | 3/2012 | Craig | A61K 6/30 433/9 |
| 2012/0171376 A1* | 7/2012 | Dodge | D06M 11/36 427/255.24 |
| 2012/0171403 A1* | 7/2012 | Dodge | C08J 9/365 428/36.1 |
| 2012/0187305 A1* | 7/2012 | Elam | C23C 16/45555 250/390.01 |
| 2012/0269968 A1* | 10/2012 | Rayner, Jr. | C23C 16/452 427/255.26 |
| 2012/0308739 A1 | 12/2012 | Lansalot-Matras et al. | |
| 2013/0001156 A1* | 1/2013 | Takeno | C23C 16/4405 117/89 |
| 2013/0014799 A1* | 1/2013 | Vidu | B82Y 10/00 136/244 |
| 2013/0025538 A1* | 1/2013 | Collins | H01L 21/67115 118/712 |
| 2013/0048629 A1* | 2/2013 | Kang | F17D 3/00 219/759 |
| 2013/0164456 A1* | 6/2013 | Winter | B05D 3/107 427/535 |
| 2013/0186452 A1* | 7/2013 | Argo | C04B 35/522 264/29.2 |
| 2013/0189810 A1* | 7/2013 | Argo | C04B 35/83 264/29.1 |
| 2013/0263776 A1* | 10/2013 | Pitney | C30B 25/12 117/85 |
| 2013/0280546 A1 | 10/2013 | Elam et al. | |
| 2013/0335190 A1* | 12/2013 | Elam | C23C 16/30 338/204 |
| 2014/0106070 A1* | 4/2014 | Mantymaki | C23C 16/30 427/255.39 |
| 2014/0225091 A1* | 8/2014 | O'Carroll | H01L 51/5225 257/40 |
| 2014/0272432 A1* | 9/2014 | Dodge | C23C 16/45525 428/446 |
| 2015/0125599 A1* | 5/2015 | Lindfors | C23C 16/45555 427/213 |

(56) References Cited

U.S. PATENT DOCUMENTS

| | | | | |
|---|---|---|---|---|
| 2015/0307989 | A1* | 10/2015 | Lindfors | C23C 16/45527 427/255.23 |
| 2018/0094352 | A1* | 4/2018 | Mane | H01L 21/28562 |
| 2018/0273550 | A1 | 9/2018 | Gordon et al. | |

FOREIGN PATENT DOCUMENTS

| | | | | |
|---|---|---|---|---|
| FR | 2980486 A1 * | 3/2013 | | C23C 16/045 |
| FR | WO 2013045788 A1 * | 4/2013 | | C23C 16/045 |
| GB | 1163979 A * | 9/1969 | | C04B 35/6286 |
| JP | 2000182979 A * | 6/2000 | | H01L 21/22 |
| JP | 2001247970 A * | 9/2001 | | C23C 16/46 |
| JP | 2005306625 A * | 11/2005 | | C23C 16/40 |
| JP | 2007-277105 A | 10/2007 | | |
| WO | WO-2009045752 A2 * | 4/2009 | | C08L 25/06 |
| WO | WO-2011037798 A1 * | 3/2011 | | C08J 9/365 |
| WO | WO-2011037831 A2 * | 3/2011 | | C23C 16/45546 |
| WO | WO-2011122059 A1 * | 10/2011 | | B01D 61/362 |
| WO | WO-2012/099658 A2 | 7/2012 | | |
| WO | WO-2013066749 A1 * | 5/2013 | | C23C 16/045 |
| WO | 2013140021 A1 † | 9/2013 | | |
| WO | 2013171360 A1 † | 11/2013 | | |
| WO | WO-2013171360 A1 * | 11/2013 | | C23C 16/4412 |

OTHER PUBLICATIONS

Oswald Siegmund. "Large Area Photodetector Development Project at Space Sciences Laboratory (SSL)." SLAC National Accelerator Laboratory. (Dec. 9, 2009). Slides 01-28. Available online at: http://lappddocs.uchicago.edu/documents/195/sendit. (Year: 2009).*

Anil U. Mane et al. "An Atomic Layer Deposition Method to Fabricate Economical and Robust Large Area Microchannel Plates for Photodetectors." Physics Procedia 37 (2012). pp. 722-732. (with preprint & TIPP 2011 slides 01-28 {2011}). doi: 10.1016/j.phpro.2012.03.720. (Year: 2011).*

Anil U. Mane et al. "A Novel Atomic Layer Deposition Method to Fabricate Economical and Robust Large Area Microchannel Plates." Proc. SPIE. 8031 [80312H] (2011). doi: 10.1117/12.882885. (Year: 2011).*

Bob Wagner. "Development of a Lower Cost Large Area Microchannel Plate Photodetector." LIGHT 11: Workshop on the Latest Developments of Photon Detectors. Tagungsstaette Schloss Ringberg, Germany. Oct. 31-Nov. 4, 2011. Slides 1-24. http://lappddocs.uchicago.edu/documents/205. (Year: 2011).*

E. Oberla, et al. "A 4-Channel Waveform Sampling ASIC in 0.13 μm CMOS for Front-end Readout of Large-area Micro-Channel Plate Detectors." Physics Procedia. 37 (2012). pp. 1690-1698. (with TIPP 2011 slides 01-30{2011}). doi: 10.1016/j.phpro.2012.03.752. (Year: 2011).*

Klaus Attenkofer, et al. "A New Approach to Photocathode Development: From the Recipe to Theory Inspired Design." 6th Int'l Conference on New Developments in Photon Detection (NDIP2011). (Jul. 4-8, 2011). Slides 01-15. Available online at: http://lappddocs.uchicago.edu/documents/200/sendit. (Year: 2011).*

Karen Byrum. "Development of Large Area Fast Microchannel Plate Photodetectors." SPIE 2011 Defense Security+Sensing (Apr. 28, 2011). Slides 01-35. Available online at: http://lappddocs.uchicago.edu/documents/189/sendit. (Year: 2011).*

Matthew J. Wetstein, et al. "Systems-Level Characterization of Microchannel Plate Detector Assemblies, Using a Pulsed sub-Picosecond Laser." Physics Procedia. 37 (2012). pp. 748-756. (with TIPP2011 preprint {2011}). doi: 10.1016/j.phpro.2012.03.717. (Year: 2011).*

O. H. W. Siegmund, et al. "Advances in Microchannel Plates for Sealed Tube Detectors." LIGHT 11: Workshop on the Latest Developments of Photon Detectors. Tagungsstaette Schloss Ringberg, Germany. Oct. 31-Nov. 4, 2011. Slides 1-17. http://lappddocs.uchicago.edu/documents/201/sendit. (Year: 2011).*

O. H. W. Siegmund et al. "Atomic Layer Deposited Borosilicate Glass Microchannel Plates for Large Area Event Counting Detectors." 6th Int'l Conf. on New Developments in Photon Detection (NDIP2011). (Jul. 4-8, 2011). Slides 01-15. http://lappddocs.uchicago.edu/documents/199/sendit. (Year: 2011).*

O. H. W. Siegmund, et al. "Atomic Layer Deposited Borosilicate Glass Microchannel Plates for Large Area Event Counting Detectors." Nuclear Instruments & Methods in Physics Research Section A. (2011). pp. 1-4. doi: 10.1016/j.nima.2011.11.022. (Year: 2011).*

O. H. W. Siegmund et al. "Development of Large Area Photon Counting Detectors Optimized for Cherenkov Light Imaging with High Temporal & Sub-mm Spatial Resolution." 2011 IEEE Nuclear Science Symposium Conference (IEEE NSS-MIC). pp. 2063-2070. http://lappddocs.uchicago.edu/documents/202/sendit. (Year: 2011).*

O. H. W. Siegmund et al. "Advances in Microchannel Plates and Photocathodes for Ultraviolet Photon Counting Detectors." Proc. SPIE. 8145 [81450J] (2011). (with slides 01-17). doi: 10.1117/12.894374. (Year: 2011).*

Valentin Ivanov et al. "Simulation of Gain and Timing Resolution in Saturated Pores." Nuclear Instruments and Methods in Physics Research A. 639 (2011). pp. 158-161. (Year: 2011).*

Anil U. Mane et al. "An Atomic Layer Deposition Method to Fabricate Economical and Robust Large Area Microchannel Plates for Photodetectors." TIPP 2011 (2011). Slides 01-28. https://indico.cern.ch/event/102998/contributions/17033/attachments/10453/15306/Tipp_457-Anil_Mane_06-11-2011.pdf (Year: 2011).*

Andrey Elagin. "SORMA West 2012: Performance of Microchannel Plates." IEEE Symposium on Radiation Measurements and Applications. (May 17, 2012). Slides 01-15. Available online at: http://lappddocs.uchicago.edu/documents/186/sendit. (Year: 2012).*

Oswald Siegmund. "Ultrafast Large Area Vacuum Detectors—Part I." III Seminario Nazionale Rivelatori Innovativ. Sezione INFN di Firenze (Jun. 5, 2012). Slides 01-37. Available online at: https://agenda.infn.it/event/4542/contributions/53649/attachments/38415/45172/Siegmund.INFN-1.pdf. (Year: 2012).*

Oswald Siegmund. "Ultrafast Large Area Vacuum Detectors—Part II." III Seminario Nazionale Rivelatori Innovativ. Sezione INFN di Firenze (Jun. 5, 2012). Slides 01-43. Available online at: https://agenda.infn.it/event/4542/contributions/53652/attachments/38399/45156/Siegmund.INFN-2.pdf. (Year: 2012).*

Ritala et al., "Rapid Coating of Through-Porous Substrates by Atomic Layer Deposition" Chem. Vap. Deposition, 2006, pp. 655-658.

Elam et al., "Conformal Coating on Ultrahigh-Aspect-Ratio Nanopores of Anodic Alumina by Atomic Layer Deposition", American Chemical Society, 2003, pp. 3507-3517.

Pham et al., "Improved Hydrothermal Stability of Niobia-Supported Pd Catalysts", Applied Catalysis A: General, 2011, pp. 153-162.

Mahurin et al., "Atomic Layer Deposition of $TiO_2$ on Mesoporous Silica", Journal of Non-Crystalline Solids, 2006, pp. 379-384.

Bjorck & Andersson, "GenX: an extensible X-ray reflectivity refinement program utilizing differential evolution," Journal of Applied Crystallography 40(6), pp. 1174-1178 (2007).

Faubert, et al., "Activation and charactterization of Fe-based catalysts for the reduction of oxygen in polymer electrolyte fuel cells," Electrochimica Acta 43(14-15), pp. 1969-1984 (1998).

George, "Fabrication and Properties of Nanolaminates Using Self-Limiting Surface Chemistry Techniques," University of Colorado Department of Chemistry and Biochemistry, ADA415471, 21 pages (2003).

International Search Report & Written Opinion for PCT/US2011/064593 dated Jul. 11, 2012, 10 pages.

Jaouen, et al., "Cross-Laboratory Experimental Study of Non-Noble-Metal Electrocatalysts for the Oxygen Reduction Reaction", Applied Materials and Interfaces 1(8), pp. 1623-1639 (2009).

Lefevre & Dodelet, "Fe-based catyalysts for the reduction of oxygen in polymer electrolyte membrane fuel cell conditions: determination of the amount of peroxide released during electroreduction and its influence on the stablity of the catalysts", Electrochimica Acta 48(19), pp. 2749-2760 (2003).

Lefevre, et al., "Iron-Based Catalysts with Imporved Oxygen Reduction Activity in Polymer Electrolyte Fuel Cells", Science 324(5923), pp. 71-74 (2009).

(56) References Cited

OTHER PUBLICATIONS

Ma, et al., "Cobalt Imidazolate Framework as Precursor for Oxygen Reduction Reaction Electroatalysts," Chemistry: A European Journal 17(7), pp. 2063-2067 (2011).
Mane & Elam, "Atomic Layer Deposition of W:Al2O3 Nanocomposite Films with Tunable Resistivity," Chemical Vapor Deposition 19(4-6), pp. 186-193 (2013).
Meng, et al., "Emerging Applications of Atomic Layer Deposition for Lithium-Ion Battery Studies," Advanced Materials 24(27), pp. 3589-3615 (2012).
Meng, et al., "SWCNT-Supported Amorphous Gallium Sulfide as a New High-Performance Anode for Lithium-Ion Batteries," 223rd Electrochemical Society Meeting, Abstract #388, 1 page (2013).
Pilvi, et al., "Atomic layer deposition process with TiF4 as a precursor for depositing metal fluoride thin films," Applied Optics 47(13), pp. C271-C274 (2008).
Pilvi, et al., "Novel ALD Process for Depositing CaF2 Thin Films," Chemistry of Materials 19(14), pp. 3387-3392 (2007).
Putkonen, et al., "Atomic layer deposition of metal fluorides through oxide chemistry," Journal of Materials Chemistry 21 (38), pp. 14461-14465 (2011).
Schroeder, et al., "Epitaxial growth of laminar crystalline silicon on CaF2," Applied Physics Letters 77(9), 1289-1291 (2000).
Sumiya, et al., "Initial growth stages of CaF2 on Si(111) investigated by scanning tunneling microscopy," Applied Surface Science 156(1-4), pp. 85-96 (2000).
Tong, et al., "Nanoclusters of MoO3-x embedded in an Al2O3 matrix engineered for customizable mesoscale resistivity and high dielectric strength," Applied Physics Letters 102, 252901, 5 pages (2013).
Wind, et al., "Nucleation period, surface roughness, and oscillations in mass gain per cycle during W atomic layer deposition on Al2O3," Journal of Applied Physics 105, 074309, 13 pages (2009).
Wu, et al., "High-Performance Electrocatalysts for Oxygen Reduction Derived from Polyaniline, Iron, and Cobalt," Science 332(6028), pp. 443-447 (2011).
Ylilammi & Ranta-Aho, "Metal Fluoride Thin Films Prepared by Atomic Layer Deposition," Journal of the Electrochemical Society 141(5), pp. 1278-1284 (1994).
Brown, et al., "Improved flexibility with grayscale fabrication of calcium fluoride homogenizers," Proceedings of SPIE 8326, 11 pages (2012).
Mane & Elam, et al., "Nanostructured composite thin films with tailored resistivity by atomic layer deposition," Proceedings of SPIE 8818, 8 pages (2013).
Mironova & Gradusova, "Measurements of the refractometric characteristics of optical materials in the 248-5000-nm spectral region," Journal of Optical Technology 79(2), pp. 112-115 (2012).
Siegmund, et al., "Microchannel plate detector technology potential for LUVOIR and HabEx," Proceedings of SPIE 10397, 14 pages (2017).
Mane, et al., "A novel atomic layer deposition method to fabricate economical and robust large area microchannel plates," SPIE Proceedings 8031, Micro- and Nanotechnology Sensors, Systems, and Applications III, 80312H, 7 pages (2011).
Binions, et al., "Aerosol-assisted chemical vapour deposition of sodium fluoride thin films," Thin Solid Films 469-470, pp. 416-419 (2004).
Elam, et al., "Viscous Flow Reactor with Quartz Crystal Microbalance for Thin Film Growth by Atomic Layer Deposition," Review of Scientific Instruments 73(8), pp. 2981-2987 (2002).
Elam, et al., "ZnO/Al2O3 nanolaminates fabricated by atomic layer deposition: growth and surface roughness measurements," Thin Solid Films 414(1), pp. 43-55 (2002).
George, "Atomic layer deposition: an overview," Chemical Reviews 110(1), pp. 111-131 (2010).
Iwahori, et al., "Optical properties of fluoride thin films deposited by RF magnetron sputtering," Applied Optics 45(19), pp. 4598-4602 (2006).
Jokela, et al., "Secondary Electron Yield of Emissive Materials for Large-Area Micro-Channel Plate Detectors: Surface Composition and Film Thickness Dependencies," Physics Procedia 37, pp. 740-747 (2012).
Lingg, et al., "Sodium fluoride thin films by chemical vapor deposition," Thin Solid Films 209(1), pp. 9-16 (1992).
Necas & Klapetek, "Gwyddion: an open-source software for SPM data analysis," Open Physics 10(1), pp. 181-188 (2012).
Samuels, et al., "Chemical Vapor Deposition of Metal Fluorides Using Sodium and Zirconium Fluoroalkoxides," Chemistry of Materials 6(1), pp. 1684-1692 (1994).
Knisley, et al., "Precursors and chemistry for the atomic layer deposition of metallic first row transition metal films," Coordination Chemistry Reviews 257(23-24), pp. 3222-3231 (2013).

\* cited by examiner
† cited by third party

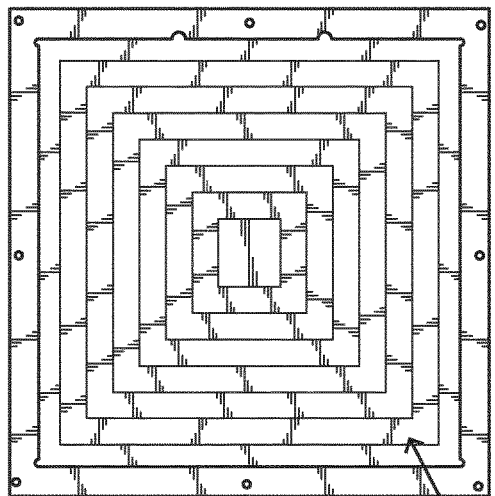
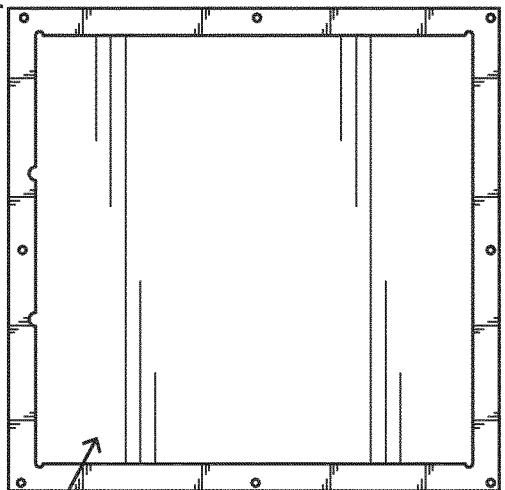
FIG. 3a Prior Art
FIG. 3b Prior Art
FIG. 3c Prior Art
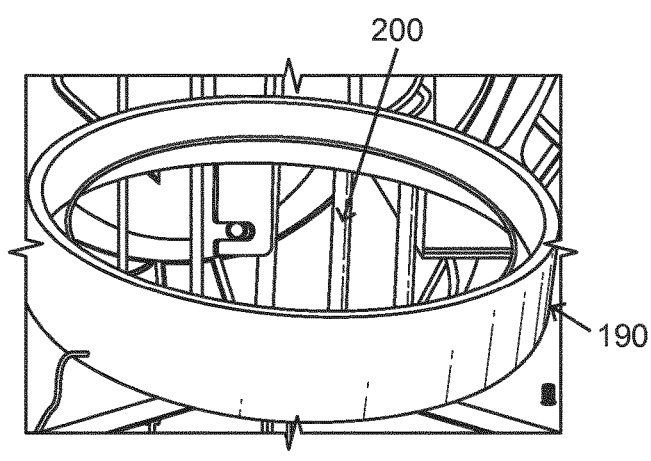
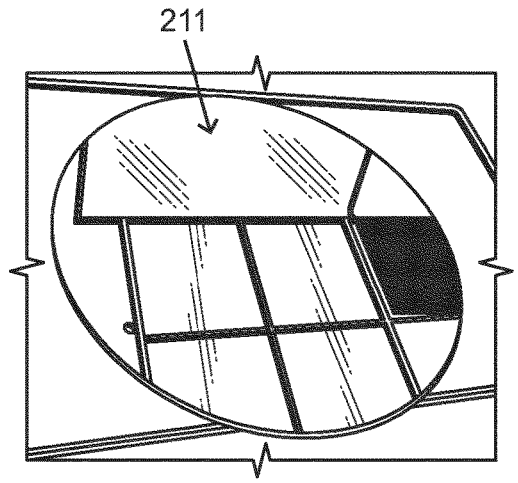
FIG. 4a Prior Art
FIG. 4b Prior Art On planer glass 12"x12" Substrate
ITO deposited very uniform <5%

Schematics of the SH with through flow arrangement ALD/CVD reactor for single porous substrate

- 110 — Inert purge gas (N2, Ar, He)
- 150
- 120
- Precursor C →
- ← Precursor A
- Precursor D →
- ← Precursor B

FIG. 13a

- Top showerhead with fine holes 130
- Porous 145 substrate
- 180 Porous substrate holder (make sure no by-pass of ALD/CVD precursors)
- Bottom showerhead (may have big holes) 140
- 185 Conical arrangement needed for smooth pumping
- Reactor heating arrangement with or without lock load
- 155
- On/off valve for static deposition
- → To vacuum pump

Schematics of the SH with through flow arrangement ALD/CVD reactor for multiple porous substrates

- 110 — Inert purge gas (N2, Ar, He)
- 150
- 120
- Precursor C →
- ← Precursor A
- Precursor D →
- ← Precursor B

FIG. 13b

- Top showerhead with fine holes 130
- Multiple porous substrate 145
- Porous substrate separation porous rings
- Porous substrate holder (make sure no by-pass of ALD/CVD precursors)
- Bottom showerhead (may have big holes) 140
- Conical arrangement needed for smooth pumping 185
- Reactor heating arrangement with or without lock load
- 155
- On/off valve for static deposition
- → To vacuum pump

- Excellent thickness uniformity

ALD W:Al2O3 (chem-1) process thickness trend on 8"x8"

- Uniformity looks excellent

ALD W:Al2O3 (chem-1) process thickness trend on Si wafer with 8"x8" on top:

- Front and back side W XRF signal looks more or less same

ALD REACTOR FOR COATING POROUS SUBSTRATES

CROSS-REFERENCE TO RELATED APPLICATIONS

This application claims priority from U.S. Provisional Application 61/761,988, filed Feb. 7, 2013, and is incorporated herein by reference in its entirety.

STATEMENT OF GOVERNMENT INTEREST

The United States Government has certain rights in this invention pursuant to Contract No. W-31-109-ENG-38 between the United States Government and The University of Chicago and/or pursuant to Contract No. DE-AC02-06CH11357 between the United States Government and UChicago Argonne, LLC representing Argonne National Laboratory.

FIELD OF THE INVENTION

This invention relates to an improved system and method for ALD/CVD deposition for coating porous substrates. More particularly, the invention relates to a system and method for coating porous substrates, such as capillary glass arrays, using an ALD reactor having a showerhead inlet section which provides a uniform flux of precursor reactants across a surface of the porous substrate, substrate fixturing to provide a flow-through geometry in which precursor reactants and carrier gas are forced to flow-through pores of the porous substrate, and a showerhead outlet section to ensure that the flow remains perpendicular to the porous substrate throughout the coating process, to minimize deposition nonuniformities and enhance the efficiency of precursor purging.

BACKGROUND

High surface area, porous substrates such as capillary glass arrays are challenging to coat efficiently by atomic layer deposition (ALD) which is well known for highly self-limiting conformal deposition. Using conventional, cross-flow ALD reactors, the upstream portion of the substrate will always experience a larger precursor flux while the downstream portion of the substrate will experience a larger flux of the reaction byproducts. Non-idealities in the ALD process, coupled with these non-uniform fluxes, can produce non-uniform hereinafter ("NU") coatings along the flow axis. In addition, the non-uniform consumption of precursor across the surface of the substrate in the direction perpendicular to the flow can be another source of NU in cross-flow reactors. An additional problem with porous substrates is that molecules such as $H_2O$ which physisorb strongly to surfaces can continue to outgas for long periods of time. When there is excess $H_2O$ precursor or the $H_2O$ is a reaction product in a porous substrate, the $H_2O$ must diffuse out of the pore in order to become entrained in the purge gas. Because the purge gas flow is normal to the axis of the pores, there is a high probabliltiy that the $H_2O$ will diffuse back into a downstream pore and again physisorb. The net result of multiple physisorption events is a trapping effect, and this introduces additional NU to the coatings along the flow axis, particularly when the $H_2O$ encounters the metal precursor (such as trimethyl aluminum) from the subsequent ALD cycle. This trapping effect can be mitigated somewhat by increasing the purge times of the ALD cycles, but this will decrease the throughput and increase the fabrication cost.

SUMMARY OF THE INVENTION

An improved ALD reactor is provided for coating substrates, particularly porous substrates having an aspect ratio, defined as pore length divided by pore diameter, of greater than about 10-1000, and a high surface area by virtue of the porosity. The system includes at least a showerhead style structure for use as a precursor inlet to provide a uniform precursor flux across the entire surface of the substrate. The porous substrate is also preferably positioned relative to the showerhead structure in a fixture that forces a flow-through geometry wherein the precursor flux and a carrier gas are required to flow through the pores of the porous substrate. In a most preferred embodiment, the flow-through reactor system includes a second showerhead style structure located downstream of the porous substrate to maintain a uniform flow that is everywhere parallel to the axis of the substrate pores. These features serve to improve the uniformity of the precursor flux, resulting in improved thickness and compositional uniformity of the deposited layers on the porous substrate. In yet another embodiment plural porous substrates can be disposed between the dual showerheads to enable deposition of material on multiple substrates.

These features and other advantages of the invention, together with arrangement and manner of operation thereof, will become apparent from the following detailed description when taken in conjunction with the accompanying drawings, wherein like elements have like numerals throughout the several drawings described below.

BRIEF DESCRIPTION OF THE DRAWINGS

FIG. 1b shows an elevation view of the reactor of FIG. 1a;

FIG. 2b shows a view of a reaction chamber of the reactor of FIG. 2a.

FIG. 3a shows an as received 8"×8" capillary glass array mounted in a stainless steel frame; FIG. 3b shows the capillary glass array after ALD functionalization with a nanocomposite of Mo:$Al_2O_3$ to produce a microchannel plate (MCP) and FIG. 3c shows a 33 mm diameter MCP after the same ALD functionalization in FIG. 3b;

FIG. 4a shows the cross-flow reaction chamber of FIGS. 2b and 2c with a 300 mm Si wafer before $Al_2O_3$ ALD deposition; and FIG. 4b shows the 300 mm Si wafer after ALD deposition of an $Al_2O_3$ coating with Trimethyl Aluminum ("TMA") and water ($H_2O$) vapour precursors;

FIG. 6c shows a 1"×1" to 12"×12" plane glass substrate with ITO (indium tin oxide) coating deposited by ALD in the cross-flow reaction chamber of FIGS. 6a and 6b;

FIG. 8 shows a photograph of a 300 mm Si wafer after $Al_2O_3$ ALD performed in the presence of an 8"×8" capillary glass array using the system of FIGS. 2c and 4a;

FIG. 12 shows Mo growth rate versus distance across a 300 mm Si wafer for Mo ALD deposited with and without the capillary glass array under different dose and purge times with deposition performed at 200° C. using $MoF_6$ and $Si_2H_6$ precursors in the cross-flow reaction chamber of FIGS. 2c and 4a;

FIG. 13a shows a schematic side view of one embodiment of a through-flow (or flow-through) system for an ALD/CVD reactor with a single porous substrate; FIG. 13b shows a schematic side view of another embodiment of a through-flow system with multiple porous substrates;

FIG. 14a shows a side view cross section of the reactor of FIG. 13a; and FIG. 14b shows a top view of the top showerhead portion of FIG. 14a;

FIG. 15b shows another view of the embodiment of FIG. 15a;

FIG. 16a shows $Al_2O_3$ deposition profiles using various conditions (with and without capillary glass arrays) for the system of FIG. 13a; FIG. 17b shows further results for deposition of W:$Al_2O_3$, (chem-1) on an 8"×8" MCP (no Si) using the system of FIG. 13a.

FIG. 18A MCP placed on bottom showerhead elevated with ceramic beads (side view); FIG. 18B MCP placement with monitor Si witness coupons on the bottom showerhead (view from top)

FIG. 19A illustrates a MCP substrate holder with side cut pieces of similar type of MCP; FIG. 19B illustrates a MCP placed with side pieces (view from top).

DETAILED DESCRIPTION OF PREFERRED EMBODIMENTS

Figure 1A:
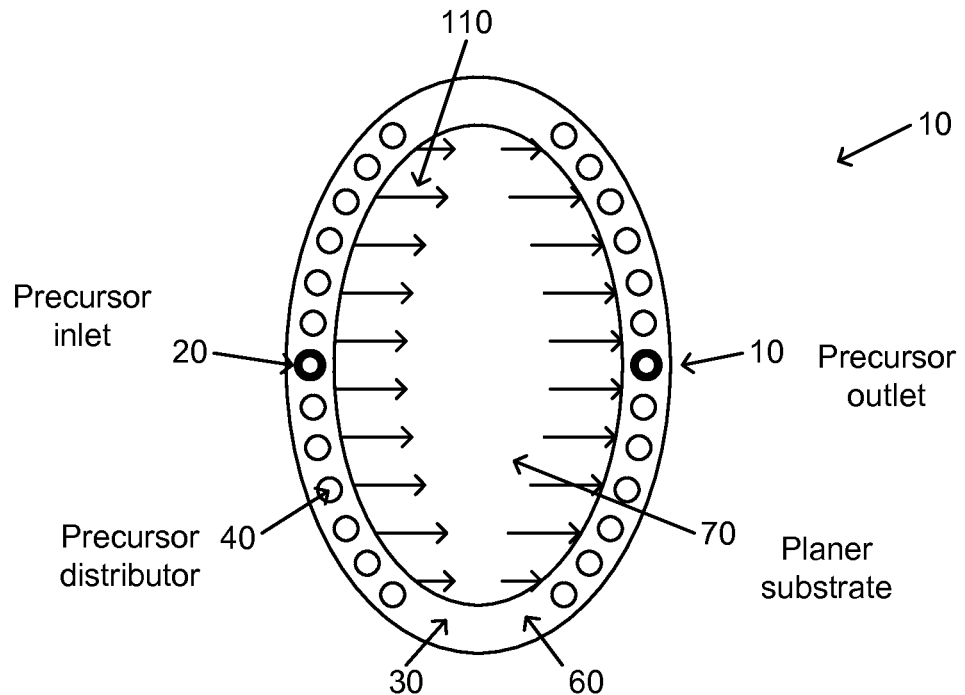
FIG. 1a shows a top view schematic of a conventional ALD cross-flow reactor.
Figure 1B:
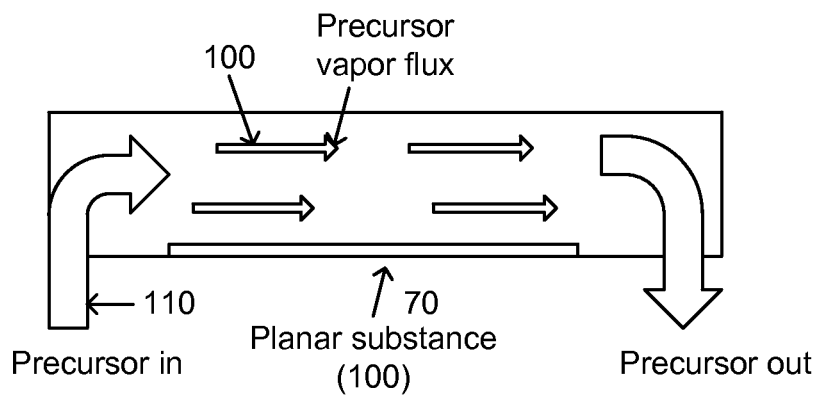

Prior art systems, such as shown in FIGS. 1a-1b, consist of an ALD cross-flow reactor 10 wherein a precursor and carrier are input through precursor inlets 20 disposed within a flow distributor plate 30. The reactor 10 further includes a precursor distributor 40, a precursor outlet 50 disposed within a second flow distributor plate 60 and a planar substrate 70. As noted by arrows 100, precursor/carrier gas 110 flows from the precursor inlets 20, flow across the planar substrate 70, and out the precursor outlet 50. As will be shown hereinafter, example data from performance of this conventional prior art reactor 10 show how such systems suffer from a number of deficiencies, including irregular layer thickness across the substrate.

Figure 2A:
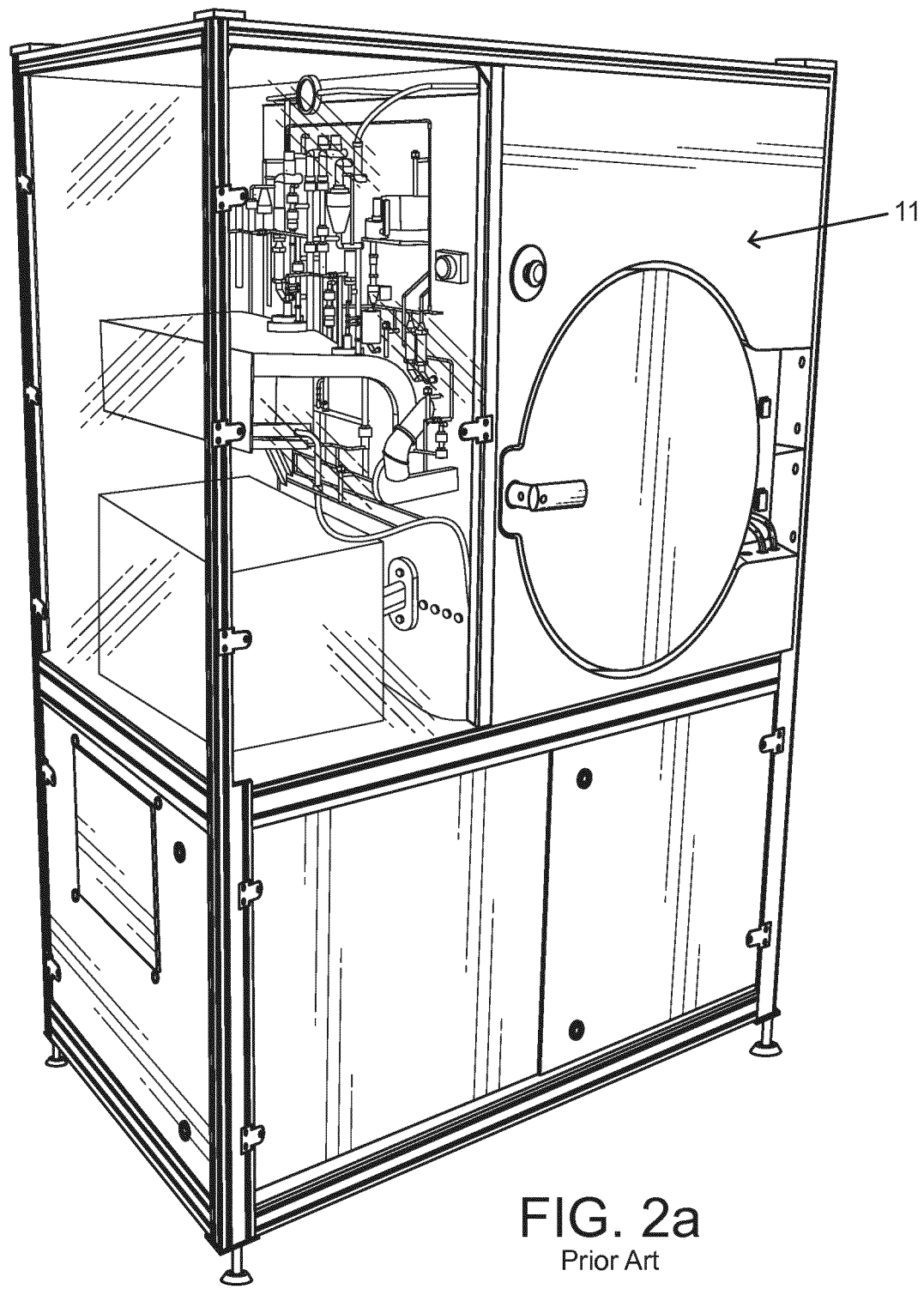
FIG. 2a shows a commercial ALD reactor.
Figure 2B:
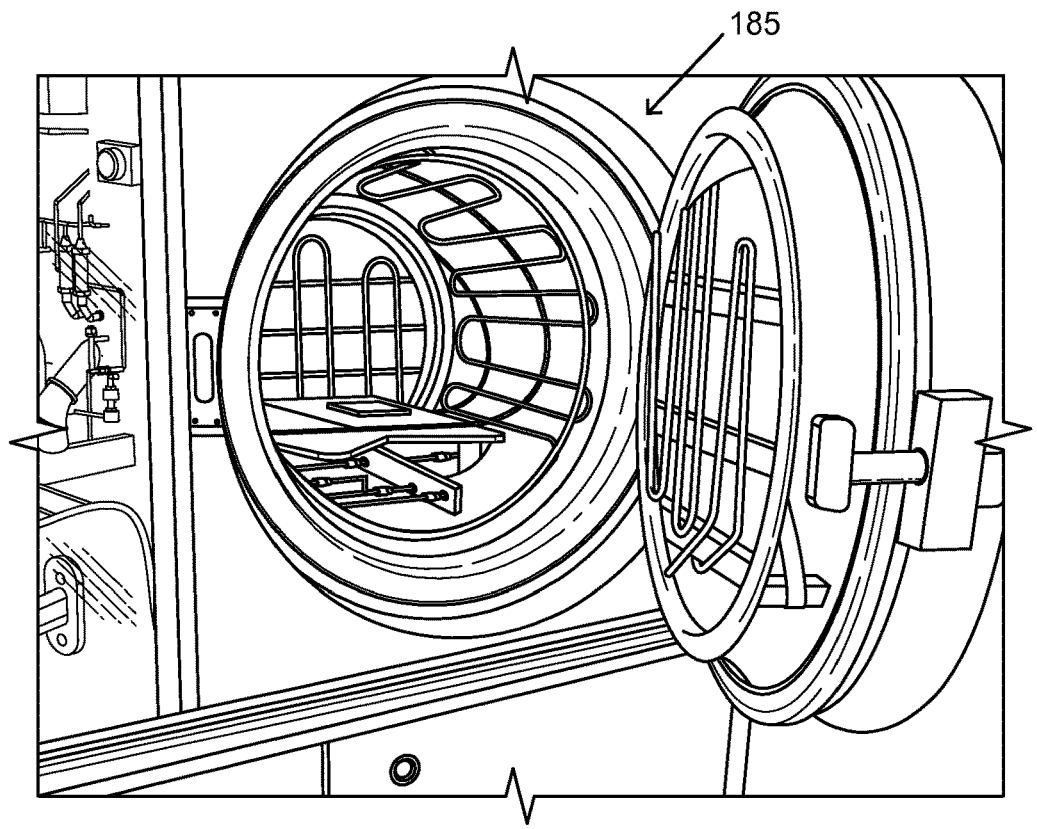
Figure 2C:
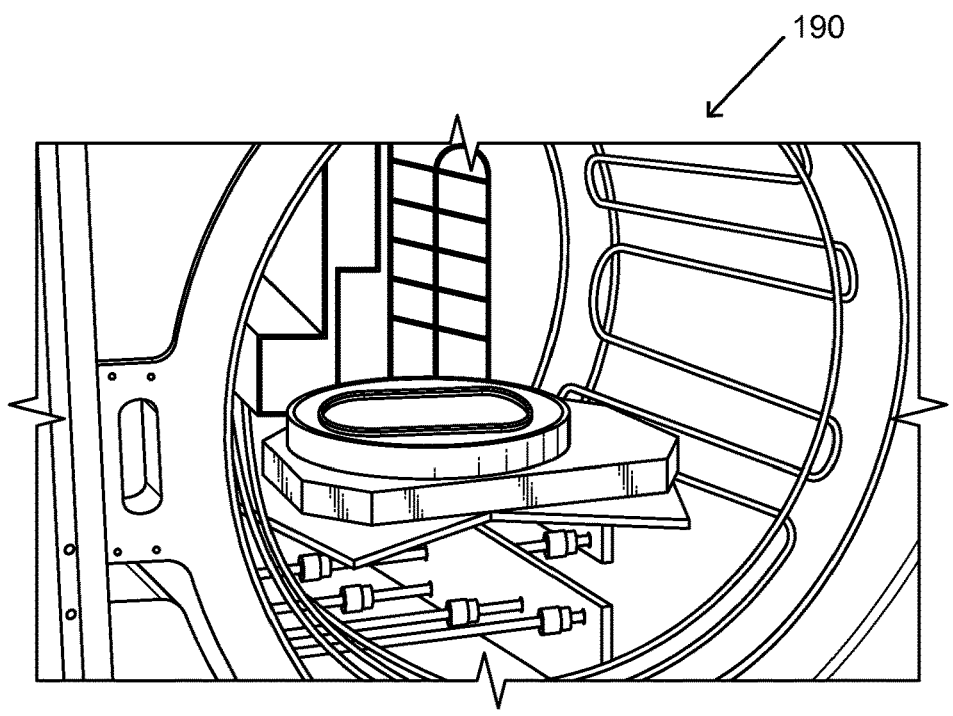
FIG. 2c shows placement of a cross-flow reaction chamber suitable for 300 mm substrates in the reactor.
Figure 5:
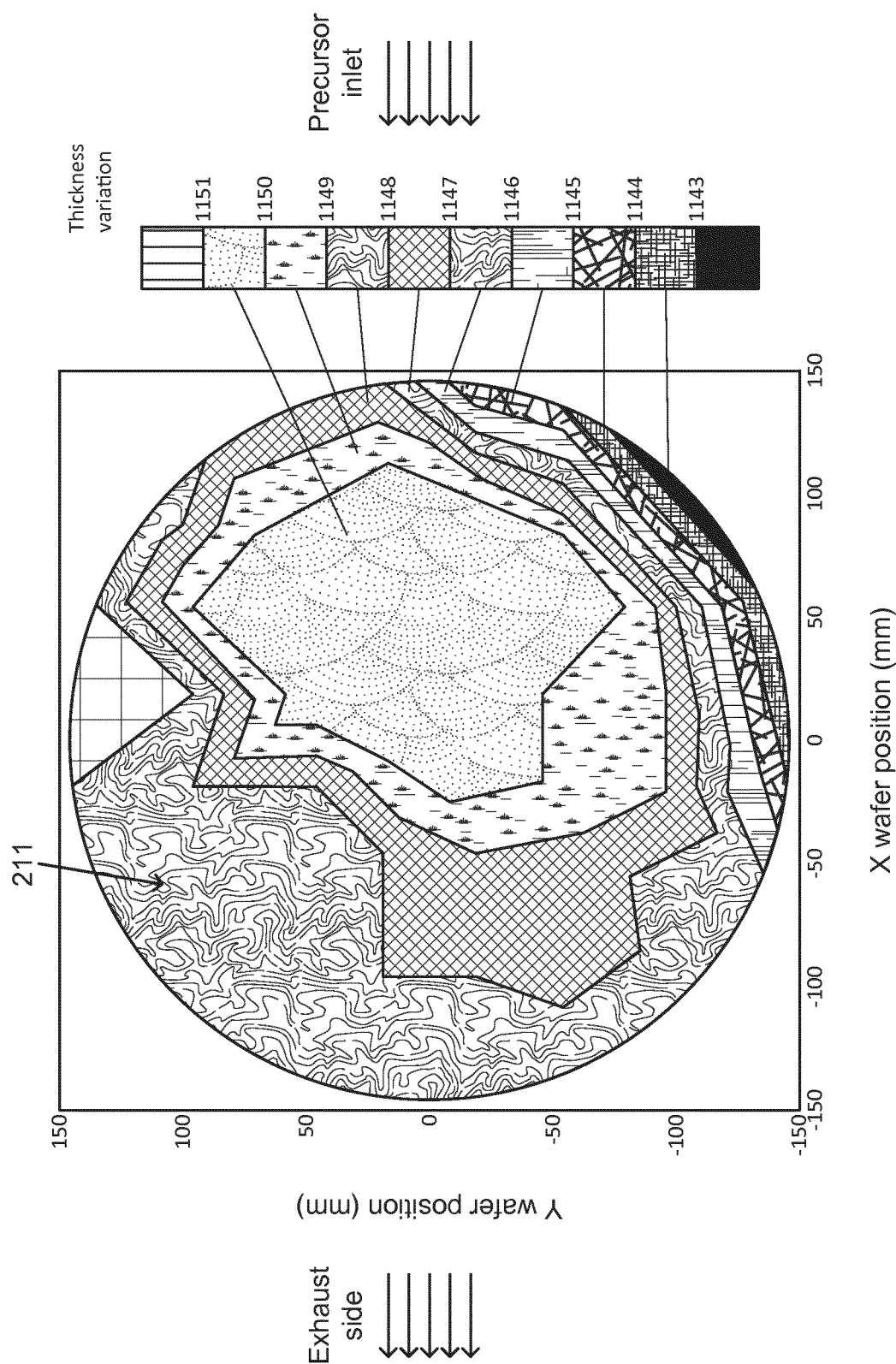
FIG. 5 shows a thickness contour plot of the ALD $Al_2O_3$ coating across the 300 mm Si wafer after the ALD deposition of FIG. 4b for 1000 ALD cycles of TMA-$N_2$ purge-$H_2O$—$N_2$ purge.

FIGS. 2a-2c illustrate various views of a commercial Beneq ALD deposition system 11. As shown in FIG. 2b, a chamber 185 has subchamber 190 for carrying out conventional cross-flow ALD deposition. In such a system certain ALD functionalities can be performed, such as the scale-up of substrate size for 33 mm MCP disks 170 (see FIG. 3c) up to 300 mm MCP. FIG. 3a shows an 8"×8:capillary glass array (MCP) 200 before deposition and FIG. 3b after ALD functionalization with a nanocomposite of Mo:$Al_2O_3$ layer 210 and FIG. 3c for a 33 mm diameter MCP also functionalized with the ALD nanocomposite layer. FIGS. 4a and 4b show photographs of 300 mm silicon wafer 201 and 211 before and after ALD functionalization in the subchamber 190 (see FIG. 4a). FIG. 5 shows a schematic of precursor input and output with a topograph of $Al_2O_3$ layer thickness across the 300 mm Si wafer 211 after ALD deposition for 1000 cycles. The referenced Si wafer is for monitoring the reaction and providing a compariable between embodiments with the MCP installed and without the MCP installed. In particular, the layer thickness is uniform on the 300 mm Si wafer coated in the cross-flow reactor without the MCP installed as evidenced by the coating thickness variation of <1% across the wafer.

Figure 6B:
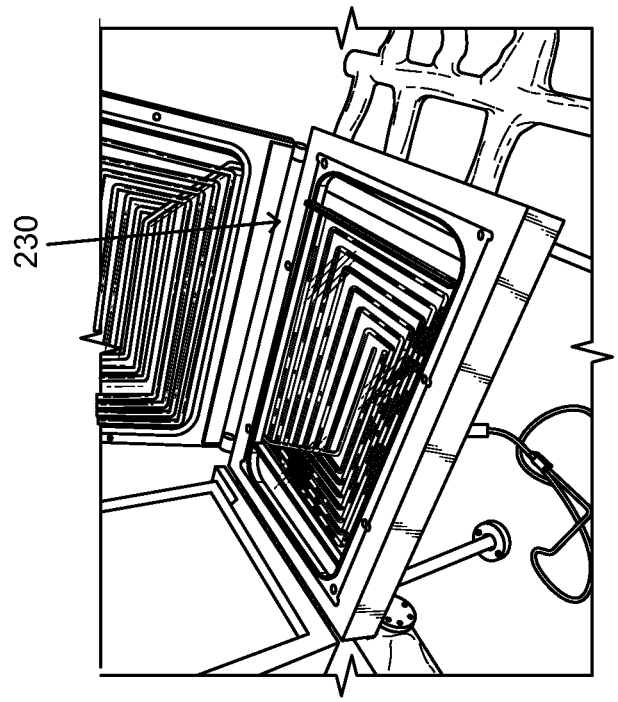
FIGS. 6a-6c show a cross-flow reaction chamber for the scale up of the ALD deposition process of FIG. 4b with FIG. 6a being an overview, FIG. 6b a close-up of the inside view of the cross-flow reaction chamber
Figure 6A:
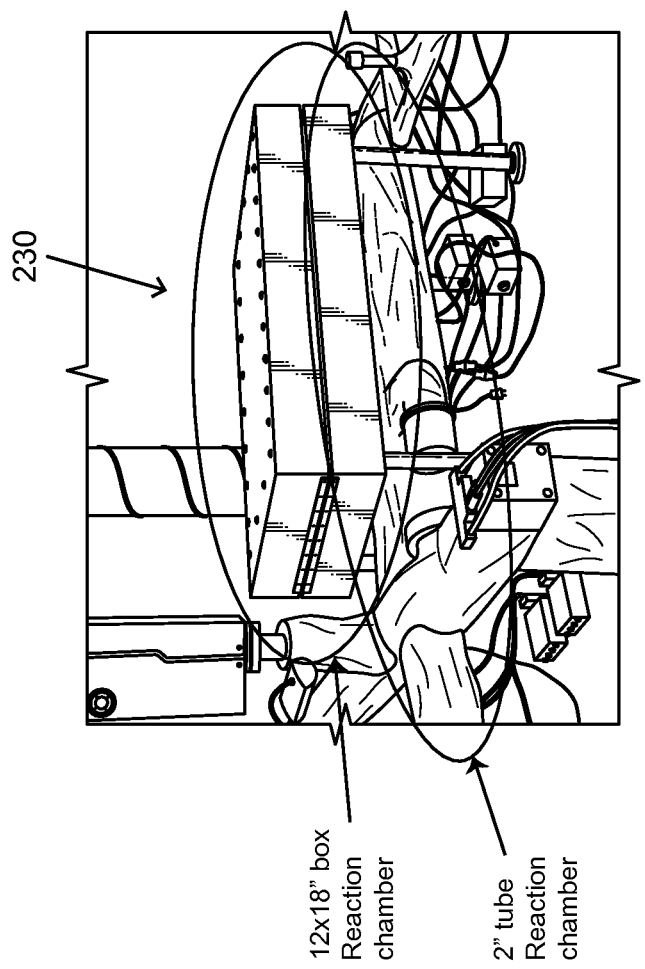
Figure 6C:
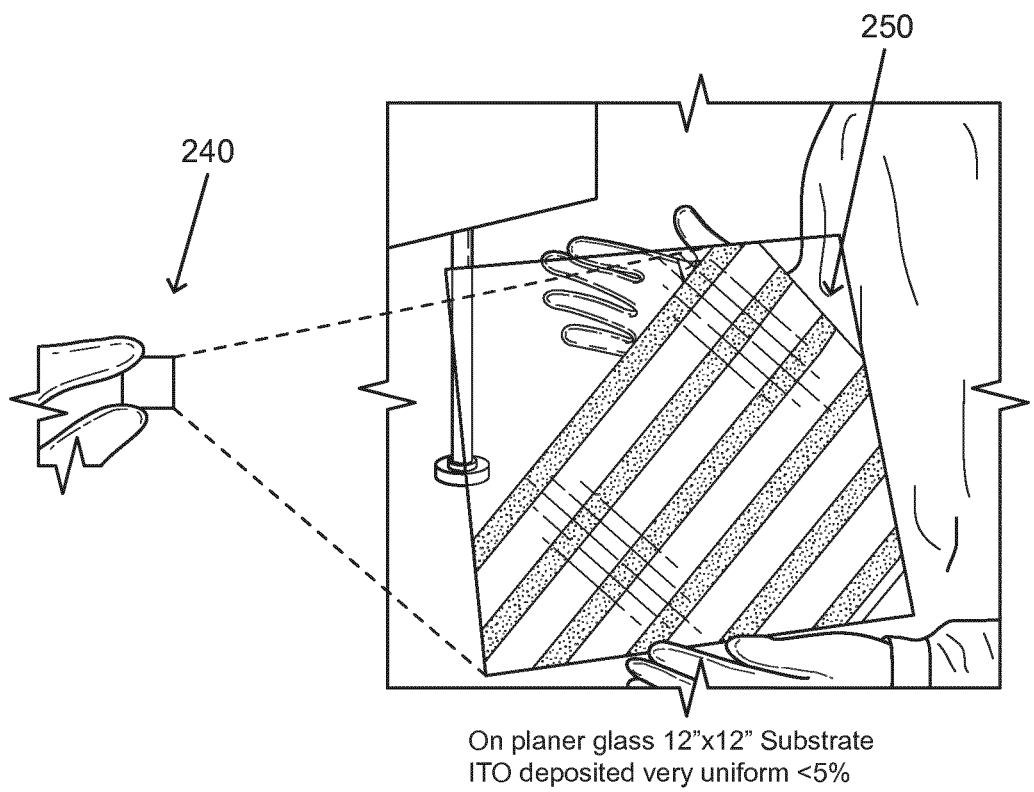
Figure 7:
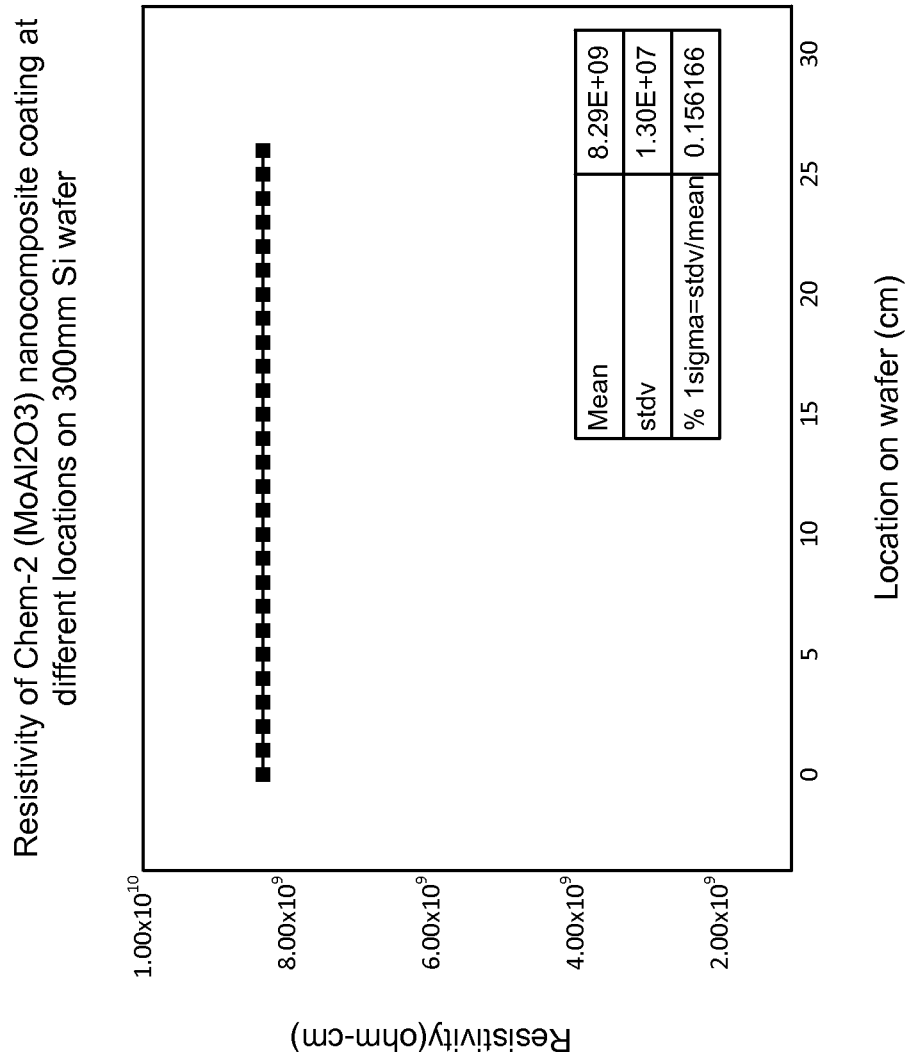
FIG. 7 shows a plot of resistivity measured at different locations across a 300 mm Si wafer for a Chem-2 (Mo—$Al_2O_3$) coating done with the system of FIGS. 6a-6c.

FIGS. 6a-6c show a scale-up of a conventional reactor with FIG. 6a being a photograph of a closed cross-flow reaction chamber 230 for depositing an ALD coating on substrates with up to 12"×18" dimensions. FIG. 6b shows an inside view of the cross-flow reaction chamber 230. FIG. 6c shows photographs of a 1"×1" scale-up to a 12"×12" glass substrate with an ALD indium tin oxide coating that is uniform in thickness within 5%. The ITO coatings on these planar substrates 240 and 250 are very uniform in thickness in the absence of a porous substrate FIG. 7 shows a plot of electrical resistivity of a Chem-2 coating (Chem-2=ALD Mo/$Al_2O_3$ nanocomposite) at different locations on a 300 mm Si wafer. The system of FIGS. 2c and 4a was used to carry out the ALD cross-flow deposition. The resistivity of the chem-2 coatings are extremely sensitive to the composition of the film, with the resistivity decreasing exponentially with increasing Mo content. The very uniform resistivity of the chem-2 film across the 300 mm Si wafer is evidence that the composition of the chem-2 coatings is very uniform in the conventional cross-flow reactor without the MCP installed.

Figure 8:
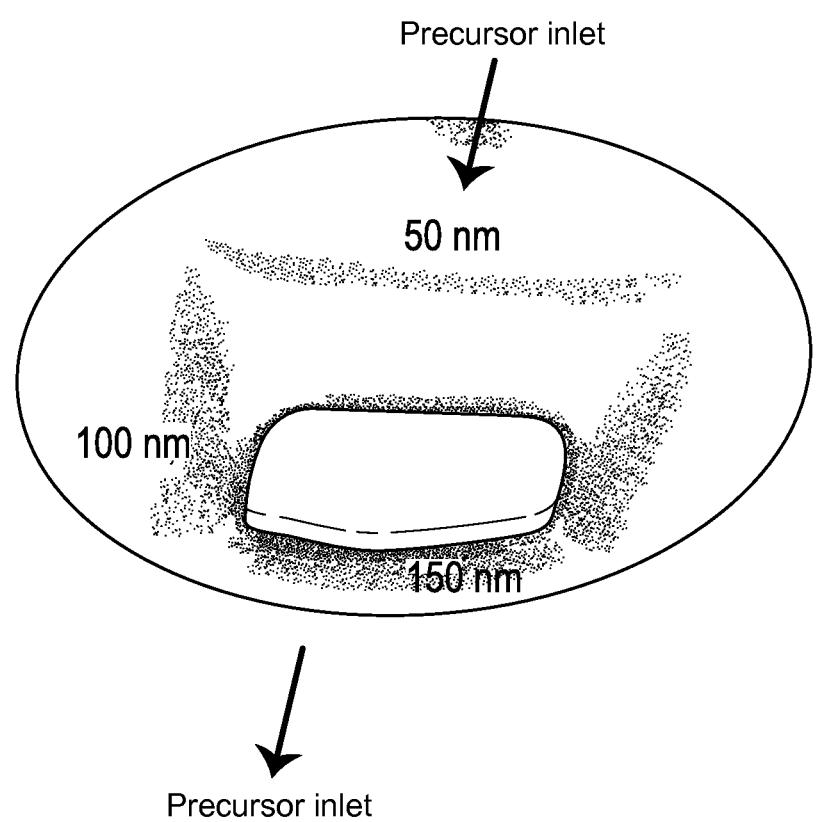

FIG. 8 shows a photograph of a 300 mm Si (100) wafer after $Al_2O_3$ deposition with a capillary glass array substrate (MCP) placed in close proximity to the wafer (note the precursor inlet and outlet) throughout the coating process. The thickness of the coating was measured at various points by spectroscopic ellipsometry, and the thickness values are indicated on FIG. 8. The data shows substantial non-uniformity of the ALD coating. In particular, the coating thickness varies by 300% (from 50 nm to 150 nm) with the MCP installed, in comparison to the <1% thickness variation obtained in the absence of the MCP as shown in FIG. 5. These depositions were performed at 200C using (Trimethyl Aluminum) "TMA" and $H_2O$ precursor.

Figure 9:
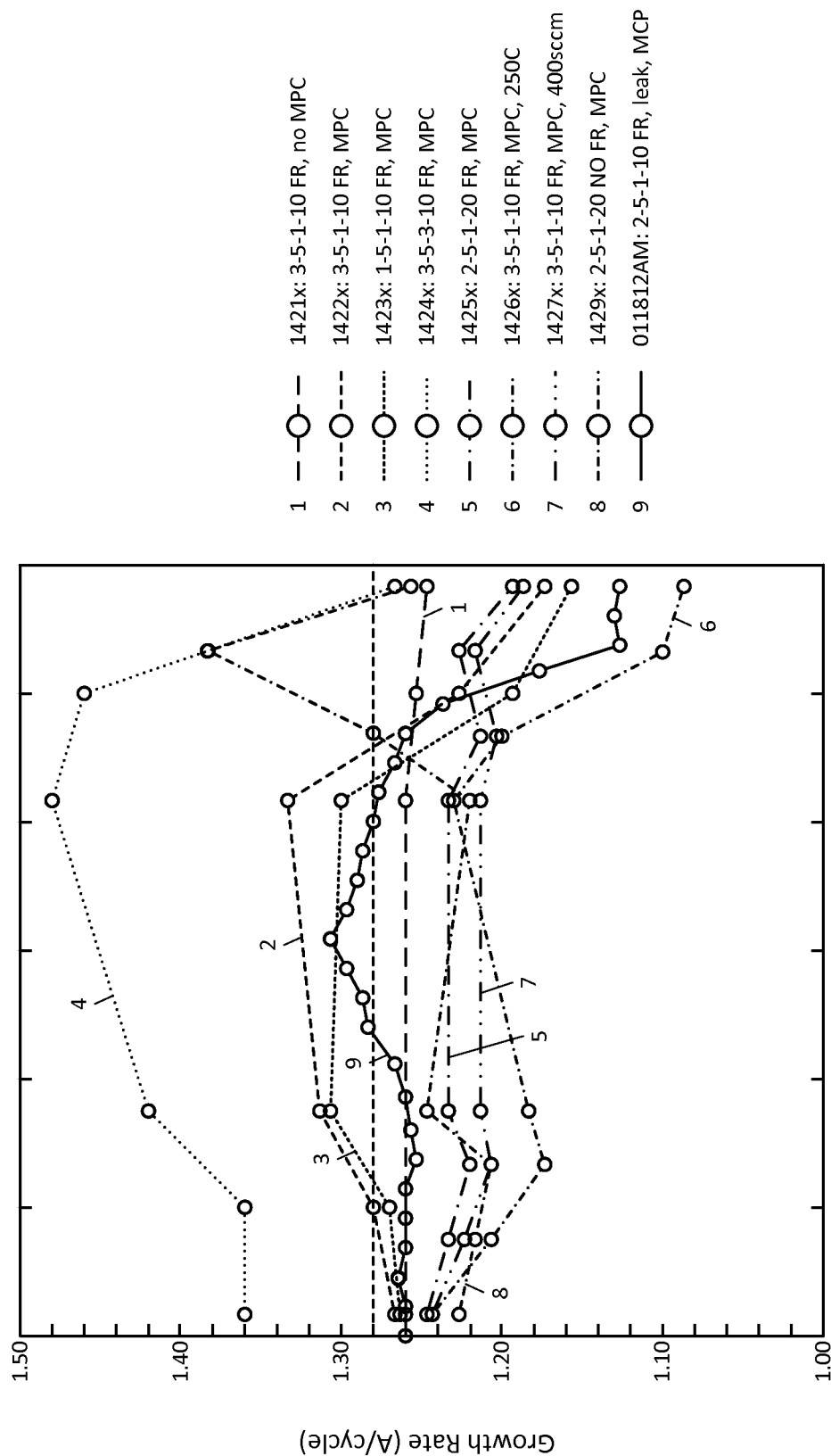
FIG. 9 shows the thickness profiles, expressed as the growth rate versus the position across 300 mm wafers, following the ALD deposition of $Al_2O_3$ in the cross-flow reaction chamber system of FIGS. 2c and 4a both with and without the presence of an 8"×8" capillary glass array using a variety of deposition conditions.

FIG. 9 shows detailed plots of ALD $Al_2O_3$ layer growth rate versus distance across 300 mm Si wafer substrates coated using the cross-flow system of FIGS. 2c and 4a. Note the plot labeled 1421x3-5-1 FR has no capillary glass array substrate (MCP) installed, whereas all others do. Deposition conditions were as for FIG. 8. The presence of the MCP resulted in highly non-uniform layer thickness across the Si wafer, regardless of the many changes in process conditions made in an effort to obtain a uniform layer thickness. Although the MCP is referenced as an example, similar porous substrates will produce the same non-uniform coatings, for instance porous substrates manufactured by sintering glass beads. Other porous substrates may be comprised of aerogels, xerogels, microfiber plates, nanotube-based mesh or cloth, and 3D-printed materials. Further, the holes need not be a regular array of holes, in certain embodiments the array will be irregular and the pores will be tortuous. These porous substrates may be intended for use in catalysis, separations, or electron multipliers.

Figure 10:
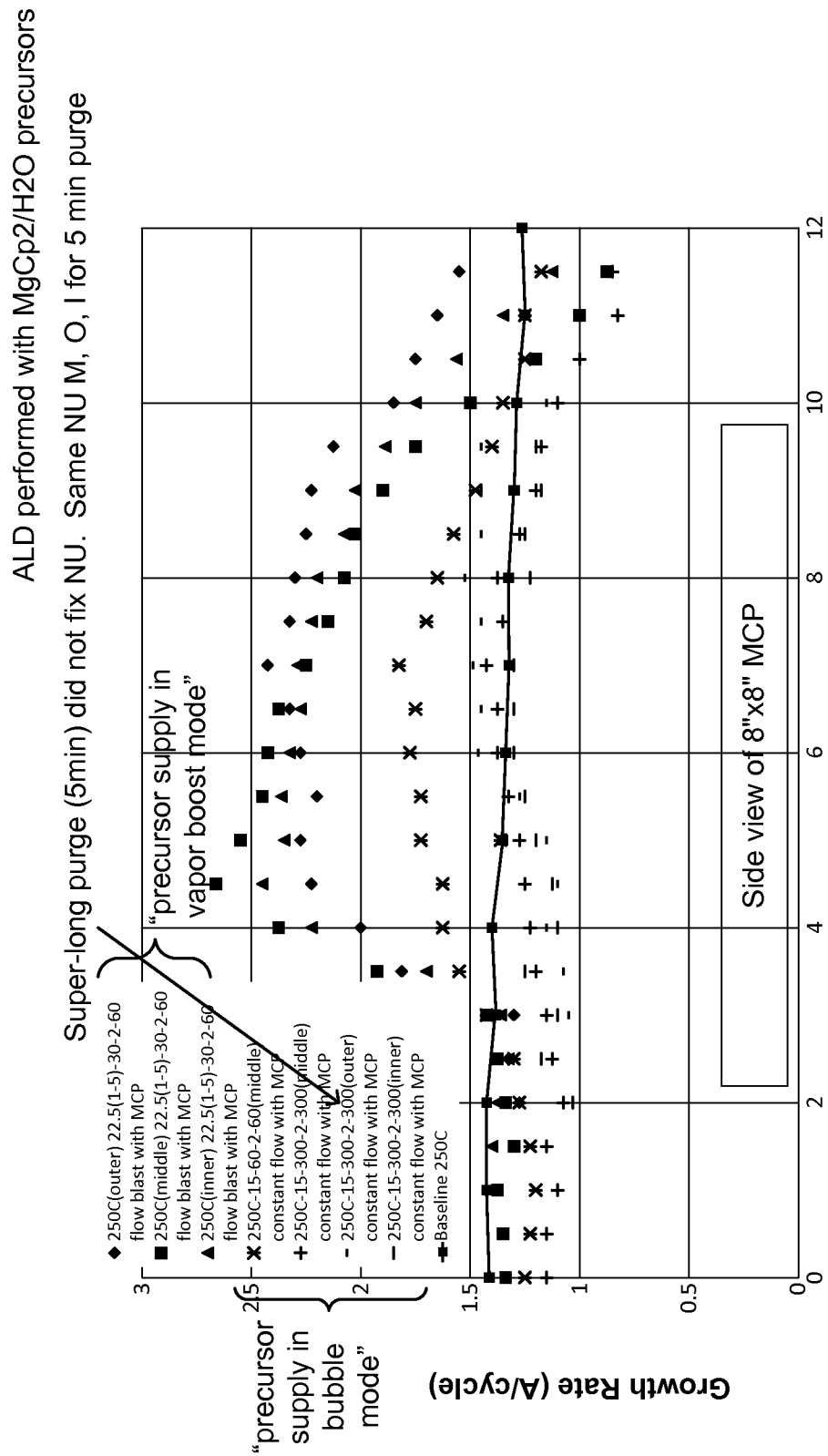
FIG. 10 shows the thickness profiles, expressed as the growth rate versus the position across 300 mm wafers, following the ALD deposition of MgO using bis-cyclopentadienyl magnesium (MgCp2) and $H_2O$ precursors in the cross-flow reaction chamber of system of FIGS. 2c and 4a in the presence of an 8"×8" capillary glass array using a variety of deposition conditions. The solid data points and line indicate the MgO growth rate measurements performed under identical conditions but with the capillary glass array removed.
Figure 11:
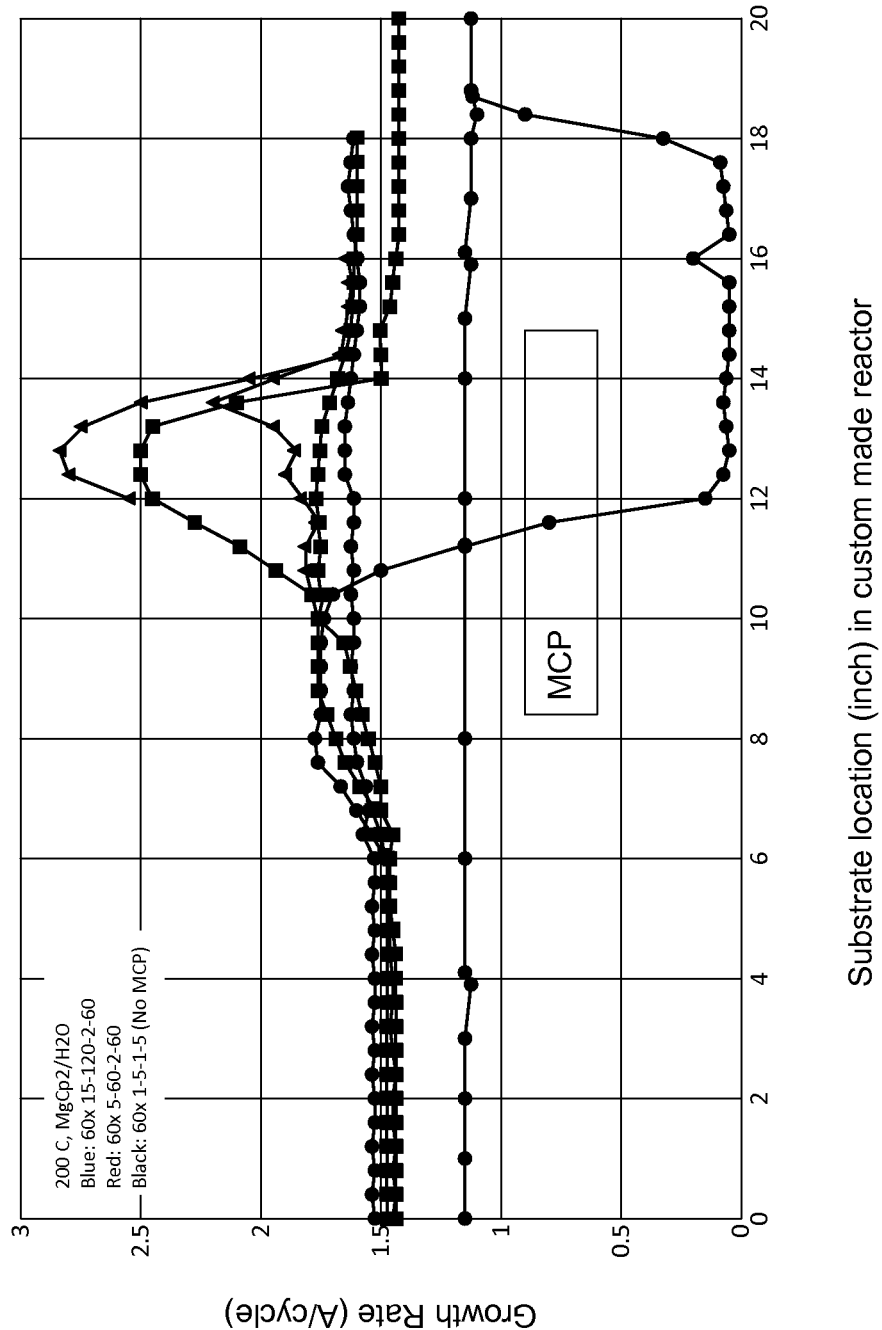
FIG. 11 shows thickness trend for MgO ALD deposited without the capillary glass array (black dots) and with the capillary glass array (colored dots) using different $Mg(Cp)_2$ dose times performed using the cross-flow reaction chamber of FIGS. 6a and 6b.

FIG. 10 shows growth rate versus location on a Si wafer for MgO coatings prepared by ALD with and without an MCP installed, and deposited using $MgCp_2$ and $H_2O$ precursors with precursor inlet located on the left side at location "0". These depositions used the cross-flow system of FIGS. 2c and 4a. The conditions were varied in an attempt to obtain a uniform MgO coating with the MCP installed. For instance, deposition was performed with flow restrictors installed, precursor was supplied under both flow-boost conditions and constant $N_2$ flow conditions. For reference, the baseline trace shows the MgO thickness without the MCP installed. Again, the MgO layer thickness is highly non-uniform with the MCP installed, as for the $Al_2O_3$ in FIG. 9, regardless of the process conditions used. FIG. 11 likewise shows non-uniform thickness for MgO deposition using the reactor system in FIGS. 6a and 6b with the MCP substrate installed, regardless of process conditions, whereas the thickness is uniform in the absence of the MCP.

Figure 12:
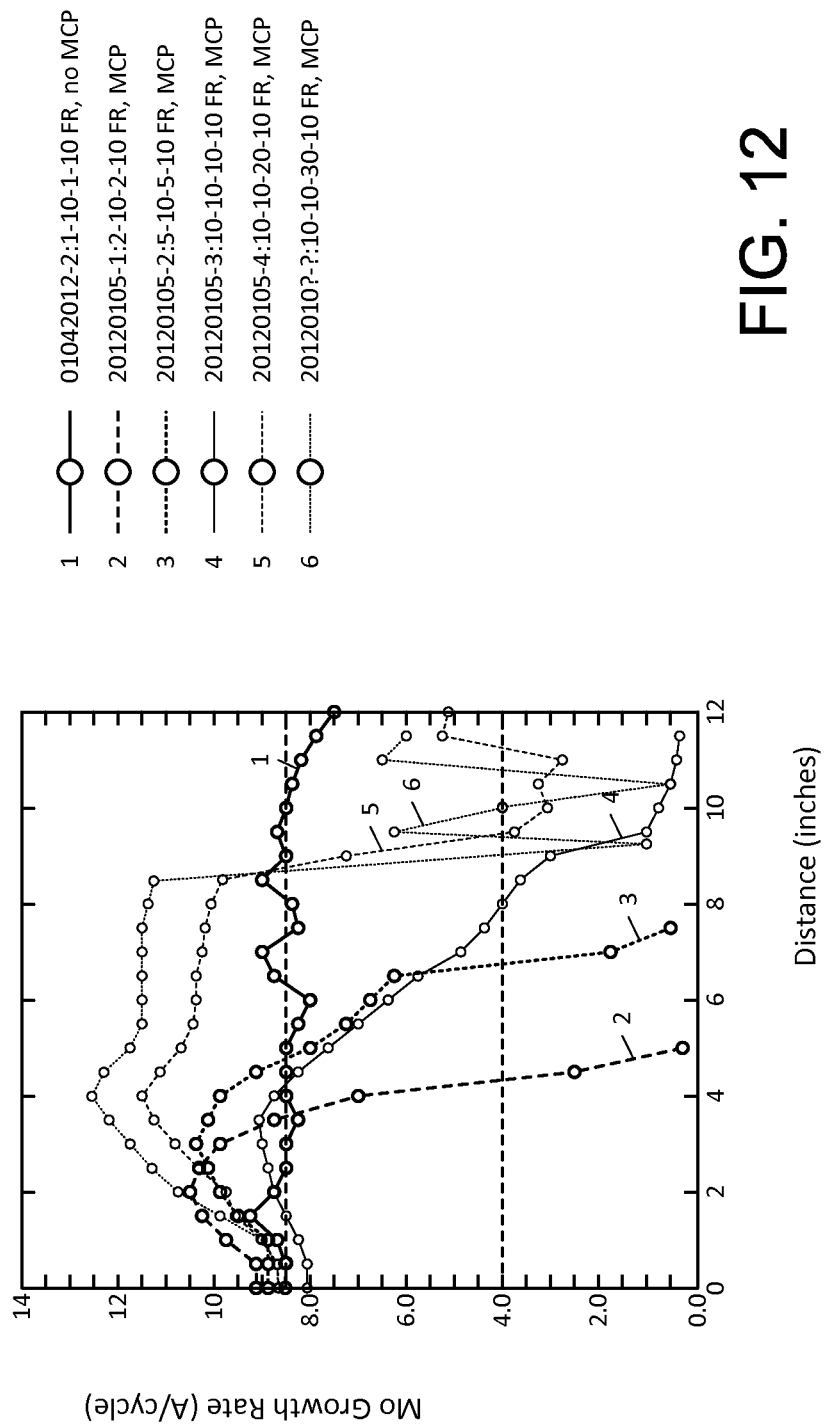

FIG. 12 is shows the variation in Mo growth rate across a 300 mm Si wafer using the cross-flow system of FIGS. 2c and 4a. As for the $Al_2O_3$ and MgO deposition, the thickness is highly non-uniform for ALD performed with the MCP substrate installed regardless of process conditions. But again, the Mo thickness is uniform in the absence of the MCP. Depositions were carried out at 200C using $MoF_6$ and $Si_2H_6$ precursors.

In preferred embodiment of the invention shown in FIG. 13a, a dual showerhead flow-through reactor 120 includes a top showerhead (or first plate) 130, a porous substrate 145, a bottom showerhead (or second plate) 140 with a central precursor injection port 150 for a precursor and the carrier gas 110. The top showerhead 130 and bottom showerhead 140 can be made out of any metal, alloy, or ceramic compatible with the process temperatures and chemical precursors for the intended ALD or CVD growth. Each of the top shower head 130 and bottom shower head 140 have a plurality of holes. The hole size and the density of the holes is selected for the desired delivery of the precursor flux. In one embodiment, the top showerhead 130 includes smaller diameter holes than the bottom shower head 140. The ratio of the hole diameters between the top showerhead 130 and the bottom showerhead 140 can be adjusted to adjust the relative conductance. Likewise the overall thickness of the holes (the showerhead thickness) for the showerheads 130, 140 dictates the conductance of the holes. In one embodiment, the top showerhead 130 and the bottom showerhead 140 are sealed to or integral with a side of the reactor 120 such that precursor cannot flow "around" the shower head but must flow-through the showerhead 130, 140.

The precursor injection portion 150 is preferably spaced sufficiently from the top showerhead 130 to allow for uniform distribution of the precursor with respect to the top showerhead 130 prior to passing through the holes in the showerhead. The precursor supply arrangement comprised of the precursor injection 150, the precursors 120, and the inert purge gas 110 can be connected only above the top showerhead 130 as shown in FIG. 13a, or can be connected both above the top showerhead 130 and below the bottom showerheads 140. Likewise, the exhaust portion 155 can be connected only below the bottom showerhead 140 as shown in FIG. 13a, or can be connected both below the bottom showerhead 140 and above the top showerhead 130. By connecting the precursor supply and the exhaust portion to both the top and bottom, the direction of flow through the porous substrate 180 can be reversed. By reversing the flow periodically throughout the deposition of the film, the film thickness can be made more uniform through the pores of the substrate.

Figure 15A:
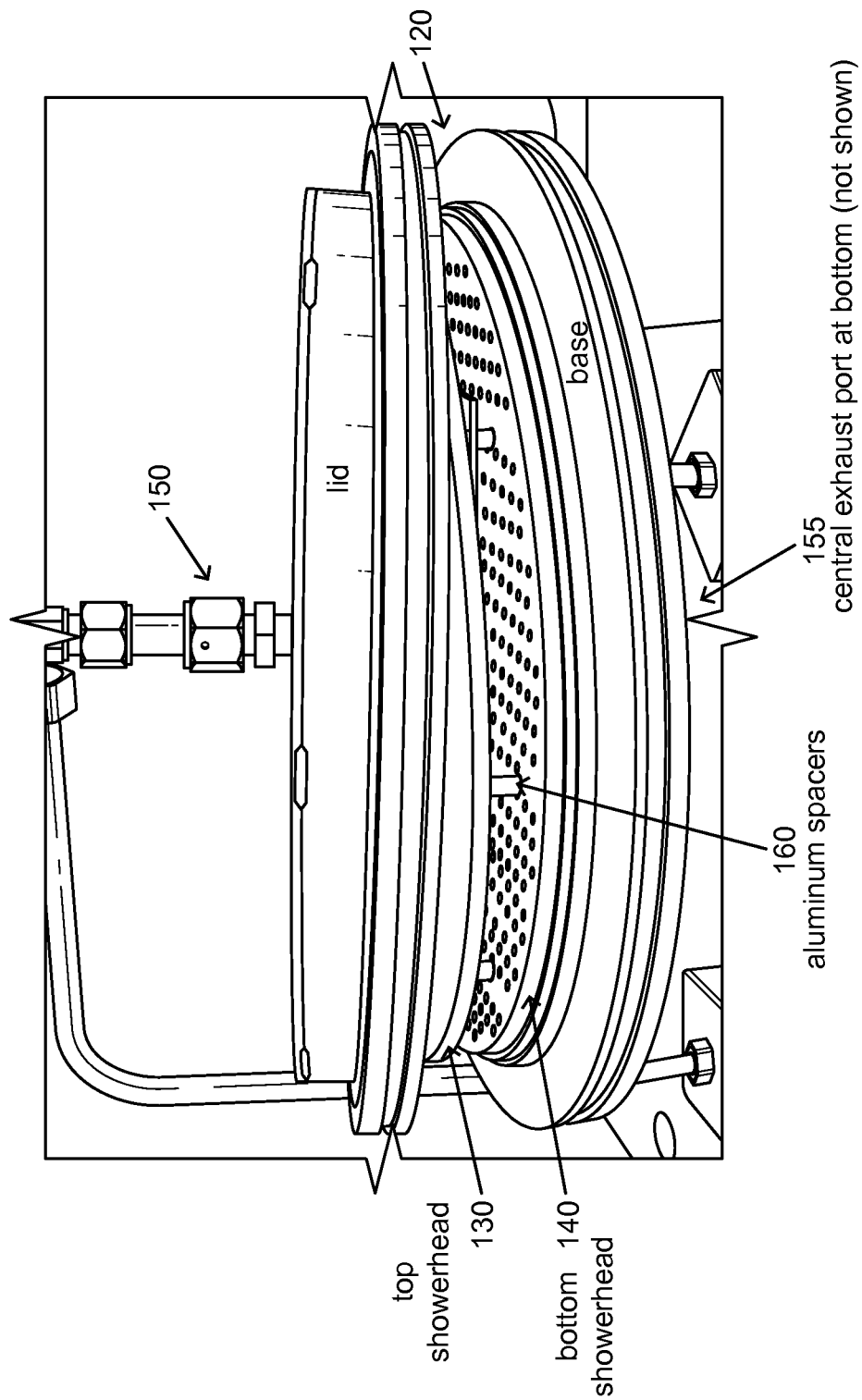
FIG. 15a shows a photograph of a flow-through reactor with dual showerheads.
Figure 15B:
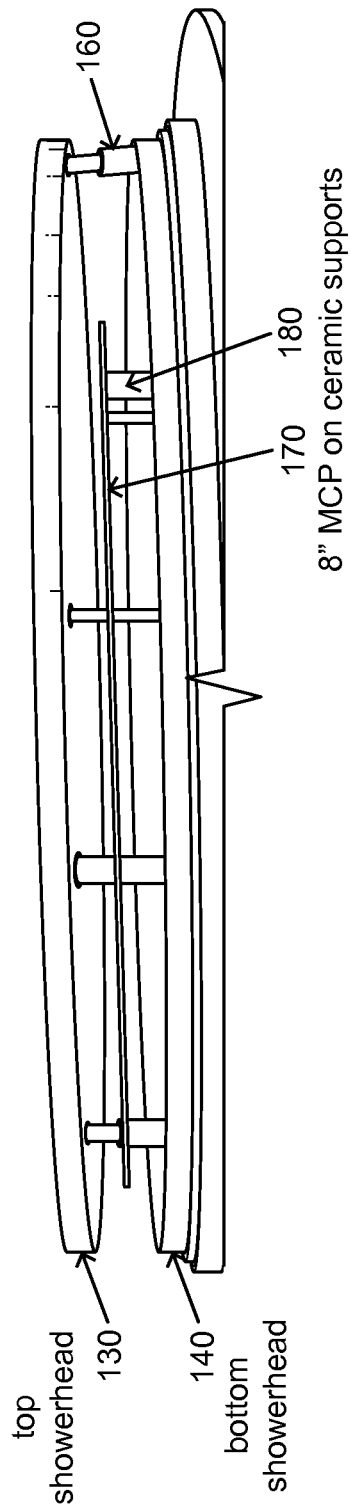

The reactor 120 further includes showerhead spacers 160 separating the top showerhead 130 and the bottom showerhead 140 and an exhaust port 155. In one embodiment, the spacers provide a spacing of up to 3-5 mm. The showerhead spacers are preferably positioned about the periphery to allow an internal space defined by the showerhead spacers and the top showerhead 130 and bottom showerhead 140 in which the MCP 145 can be placed. In one embodiment, the MCP 145 is positioned on ceramic supports 180 (see FIG. 15b) and also disposed between the top showerhead 130 and the bottom showerhead 140. In one embodiment, the exhaust port 155 is in communication with a pump to assist in evacuating the reactor and in moving the precursor through the showheads 130, 140. Note also a conical output section 185 of the reactor 120 provides improved pumping. In another embodiment shown in FIG. 13b a plurality of flow-through substrates 145 can be used in the flow-through reactor 120.

Figure 14A:
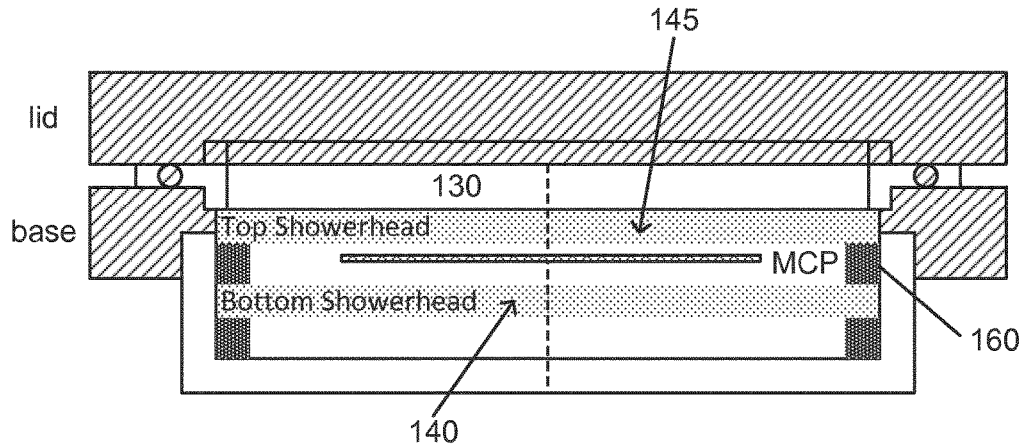

Design considerations for one embodiment of the top showerhead 130 in FIG. 14a are given below. The diameter of the holes 185 (d) is selected to be much larger than the mean free path of the carrier gas to ensure viscous flow through the pores (e.g. d=1 mm). The spacing between the holes (L) is selected to be several times smaller than the average lateral diffusion length for the ALD precursor to ensure that the precursor exiting the pore spreads out evenly before encountering the porous substrate 145. For instance, L=9 mm. The gap between the top showerhead 130 and the porous substrate 145 (G) should be minimized to ensure that the carrier gas sweep is effective, and that the overall residence time of the precursors in the showerhead reactor is short. At the same time, G should be sufficiently large to permit lateral diffusion of the precursor given the choice of L. For instance, with L=9 mm, G=10 mm. The gap between the precursor inlet tube 155 and the top showerhead 130 (H) should be minimized to reduce the overall residence time of the precursors in the showerhead reactor. However, H must be sufficiently large that the gas from the precursor inlet tube 155 spreads out uniformly before entering the top showerhead 130. That is to say that the conductance of the volume above the top showerhead must be much larger than the conductance of the top showerhead itself 130. For instance, H=10 mm. The bottom showerhead 140 should have a similar design to the top showerhead 130 (d=1 mm, L=9 mm) to maintain a parallel flow direction before and after the porous substrate 145. Similarly, the gap heights below the porous substrate 145 should be similar (G=10 mm, H=10 mm) for the same reasons given above.

Figure 14B:
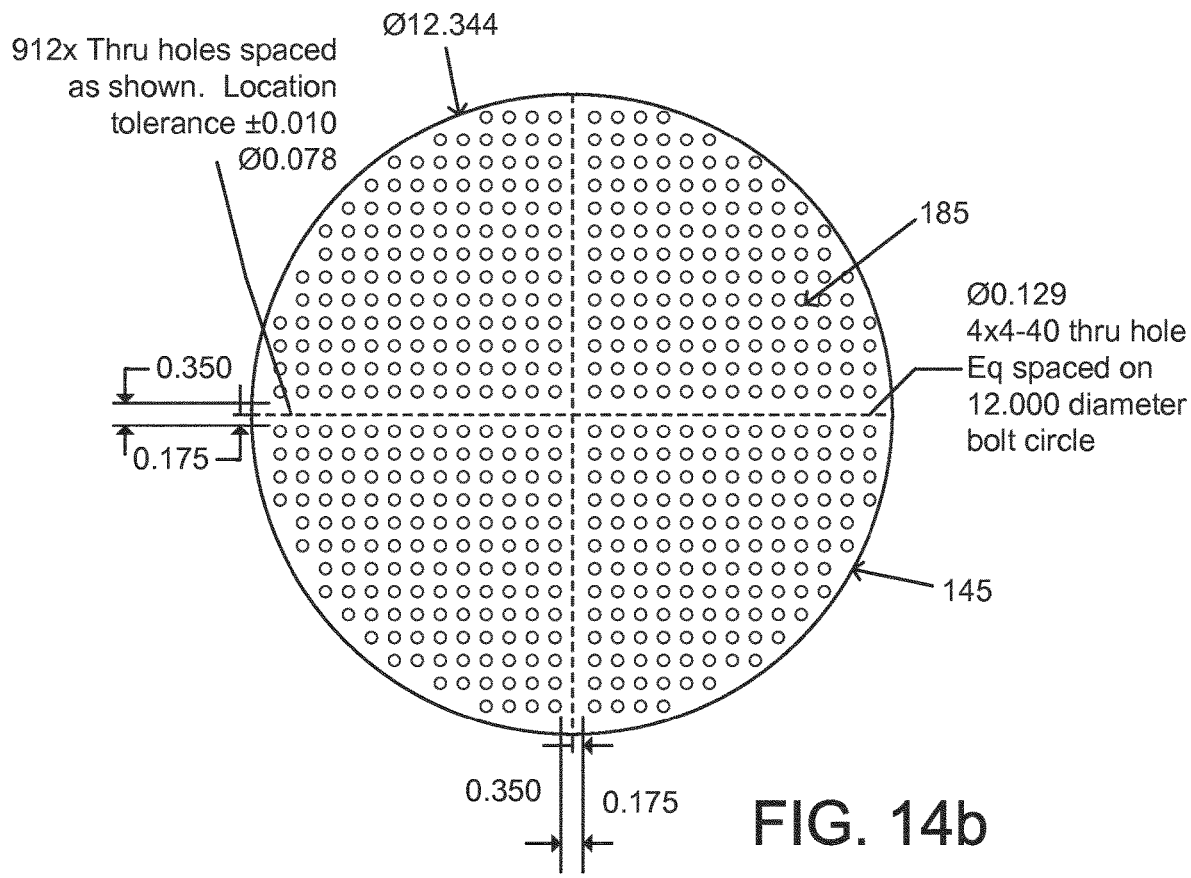
Figure 16A:
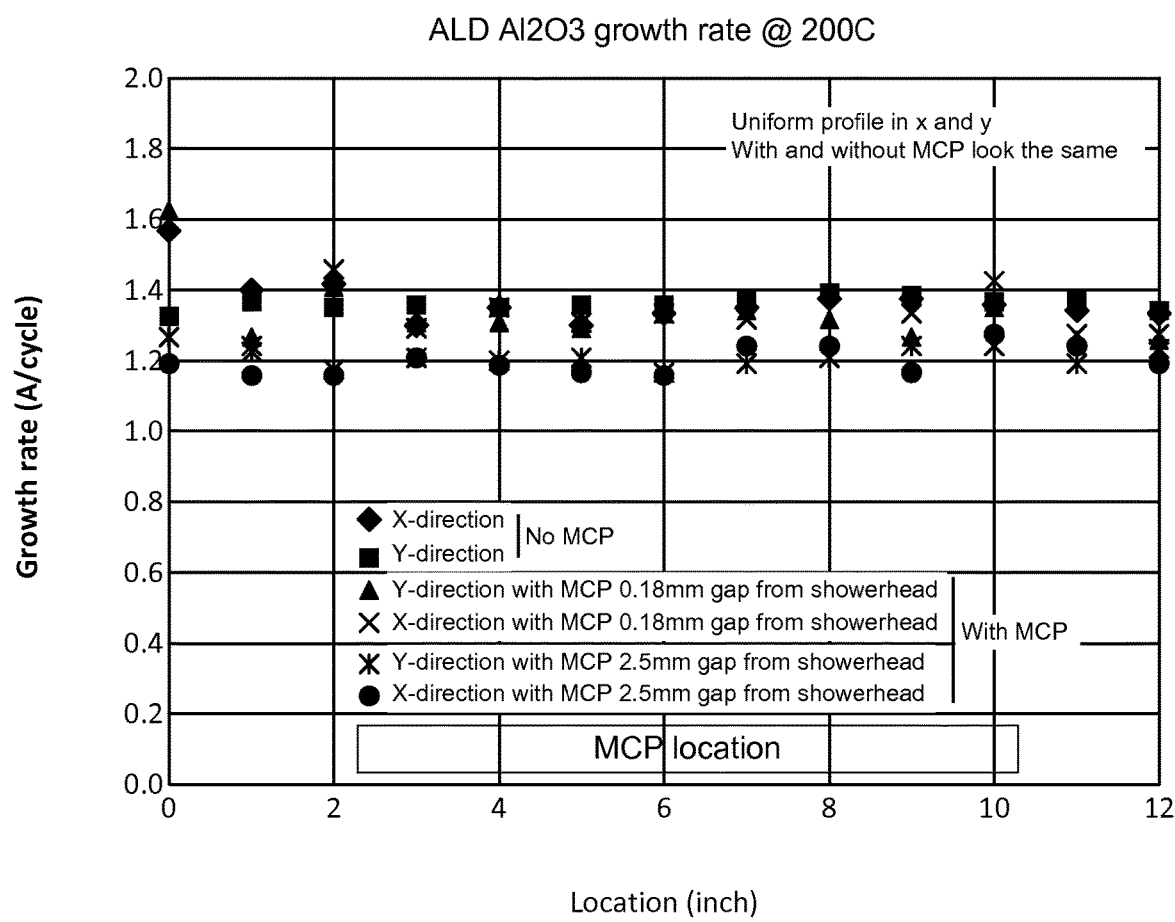
Figure 16B:
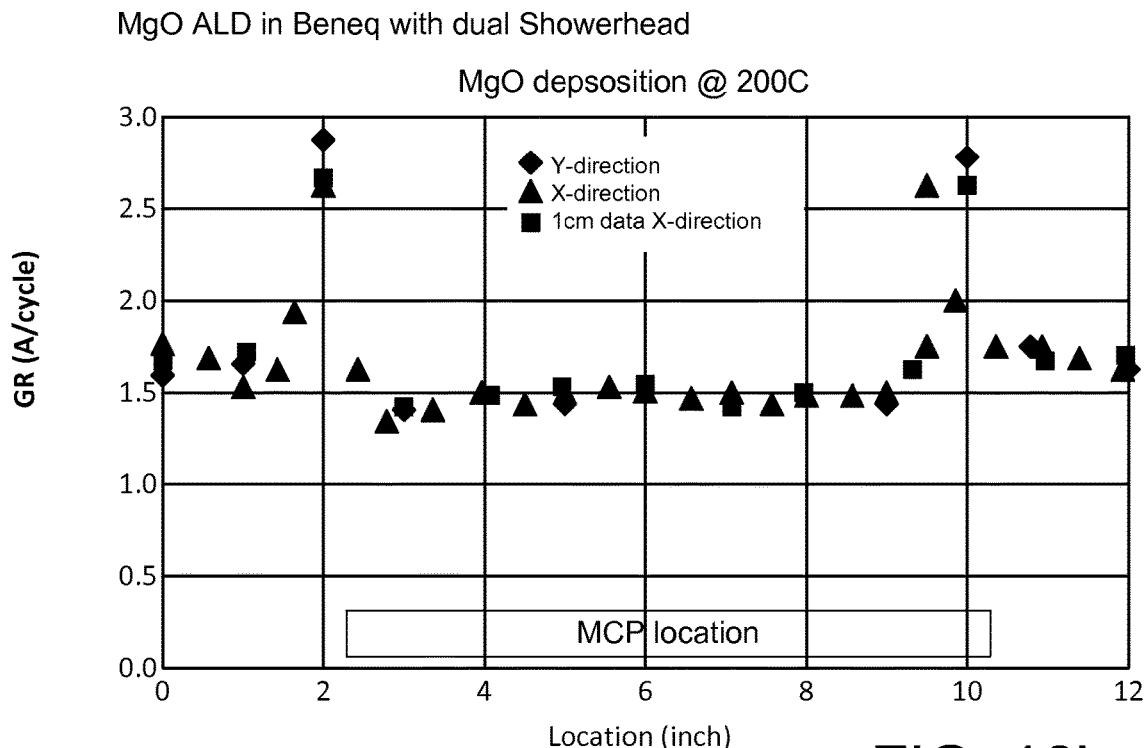
FIG. 16b shows MgO deposition growth rate with the Si coupons placed below the MCP.
Figure 17A:
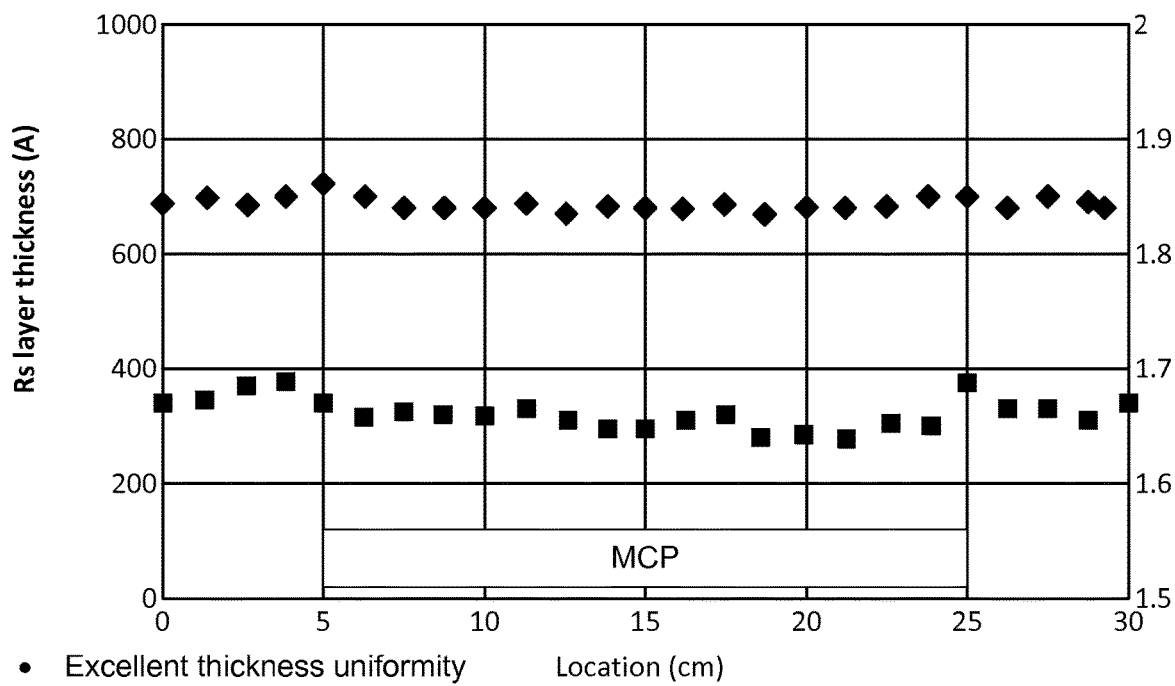
FIG. 17a shows thickness and refractive index of W:$Al_2O_3$, (chem-1) on Si (100) coupons using the system of FIG. 13a with deposition for an 8"×8" capillary glass array disposed on top at 150° C. using $WF_6$ and $Si_2H_6$ for W and with TMA and $H_2O$ for $Al_2O_3$.
Figure 17B:
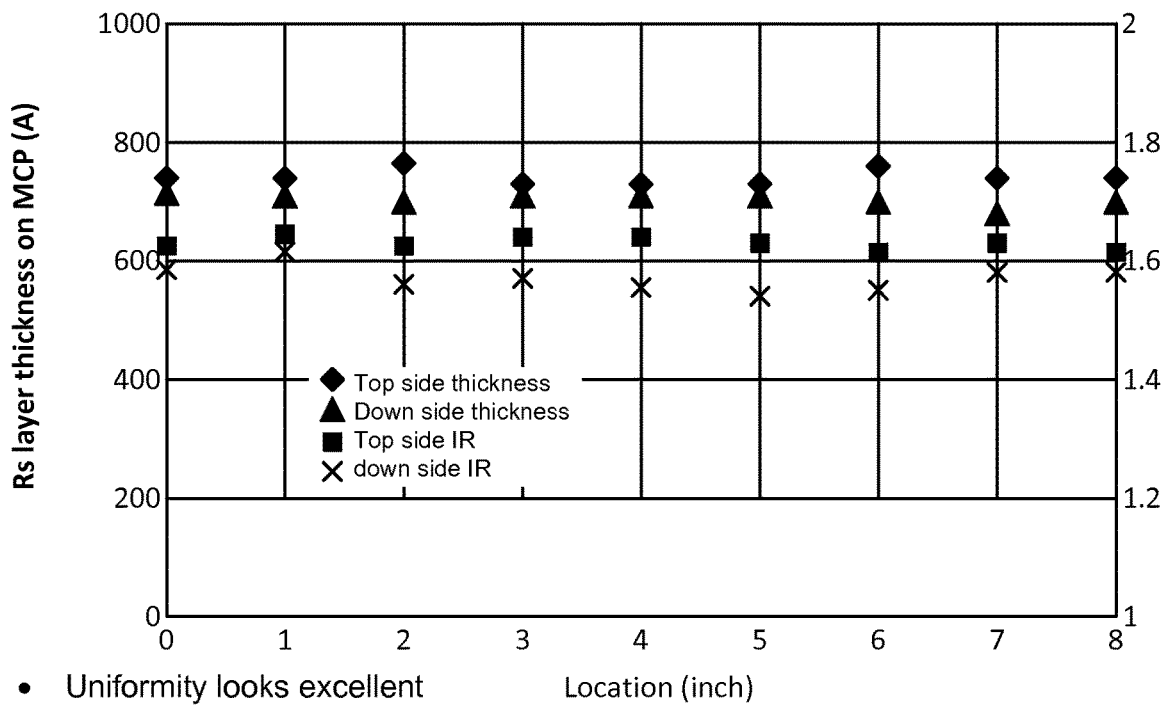
Figure 17C:
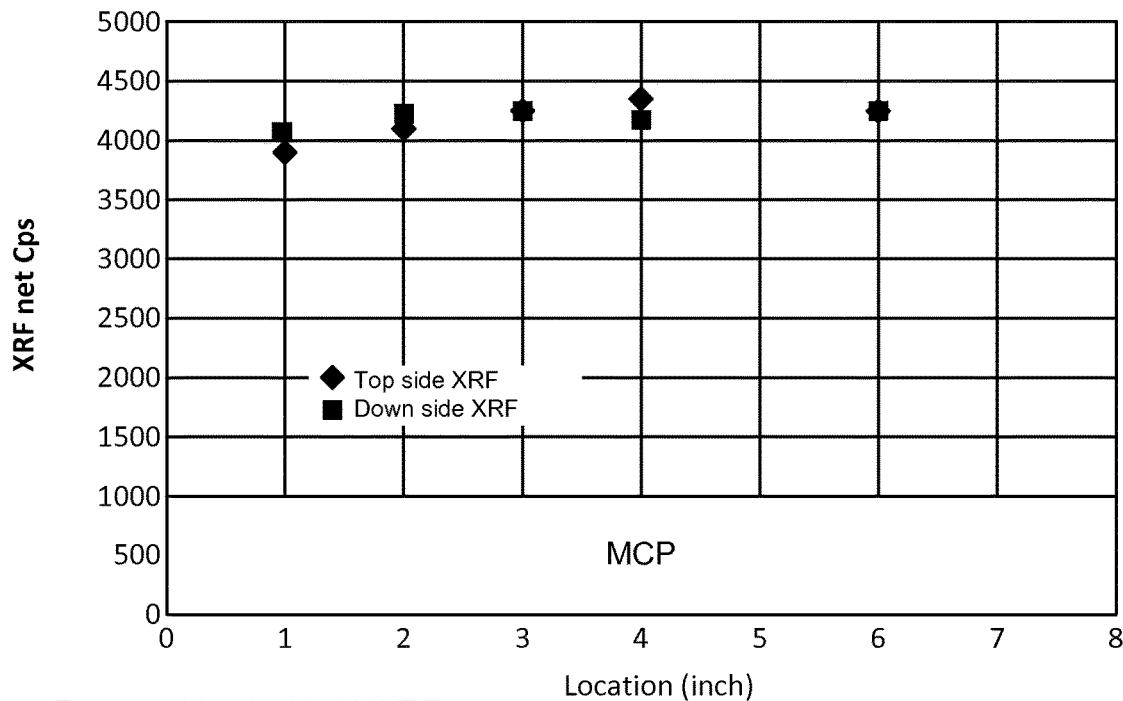
FIG. 17c shows X-ray fluorescence analysis of the relative W concentration from front and back sides of the MCP versus location on the MCP, deposited uniformly and done at 150° C. using $WF_6$ and $Si_2H_6$ for W and TMA and $H_2O$ for $Al_2O_3$.

Further details of the reactor 120 are shown in FIGS. 14a and 14b. As noted in FIG. 14b, the top view of the top showerhead 130, there is a matrix of through holes 185 which enable controlled flow-through of the precursor/carrier gas 155 to impact on the intervening MCP 145 for deposition of material. In FIGS. 16a and 16b are shown example data with FIG. 16a showing ALD deposition of $Al_2O_3$, with and without the MCP 145. Likewise, FIG. 16b shows MgO ALD deposition under various conditions with and without MCP 145. FIGS. 17a-17c further show ALD deposition of W:$Al_2O_3$ (Chem-1) with various system features with and without MCP 145. FIG. 17a shows thickness and refractive index of W:$Al_2O_3$, on Si (100) using the system of FIGS. 15a, 15b with deposition for an 8"×8" MCP disposed on top at 150° C. using $WF_6$ and $Si_2H_6$ for W and with TMA and $H_2O$ for $Al_2O_3$; FIG. 17b shows further results for deposition of W:$Al_2O_3$, (Chem_1) on an 8"×8" MCP (no Si) using the system of FIGS. 15a, 15b and using an 8"×8" MCP performed at 150° C.; and FIG. 17c shows X-ray fluorescence analysis from the front and back sides of the MCP versus location on the MCP, deposited uniformly and done at 150° C. using $WF_6$ and $Si_2H_6$ for W and TMA and $H_2O$ for $Al_2O_3$. Taken together, we see that cross-flow reaction chambers, whether commercial or scale-up, are suitable for depositing uniform films onto planar substrates of a variety of materials (MgO, $Al_2O_3$, Mo) in the absence of a high surface area porous substrate. However, in the presence of a high surface area porous substrate, the cross-flow reaction chambers consistently produce non-uniform coatings regardless of the process conditions. In contrast, the dual-showerhead flow-through reaction chamber gives uniform coatings of these materials even in the presence of the porous, high surface area substrates such as the MCP.

Figure 18A:
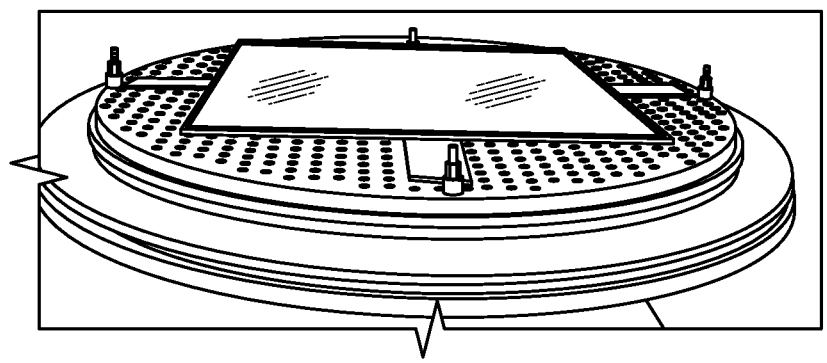
FIGS. 18A-B illustrate one embodiment of a 8"×8" porous capillary glass array substrate (MCP) placement inside the dual showerhead ALD reaction chamber.
Figure 18B:
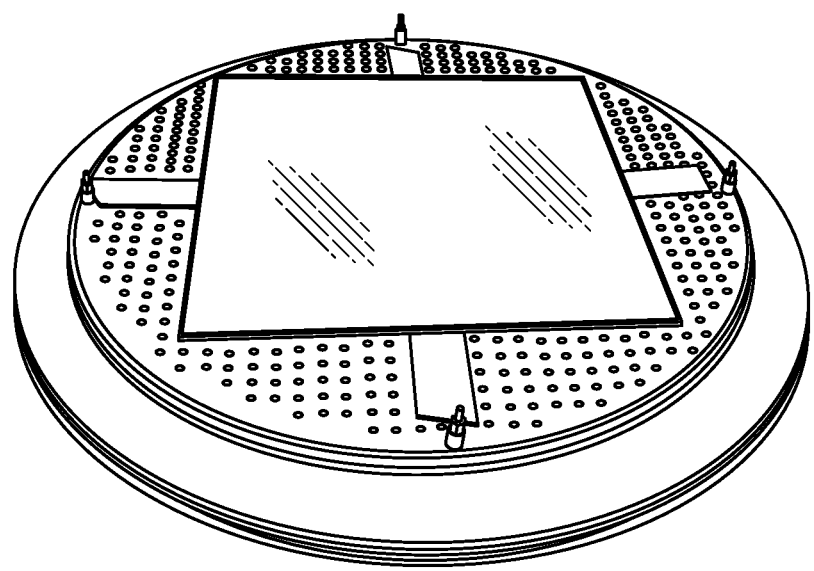

In one embodiment, illustrated in FIGS. 18a-b, the porous substrate 145 is placed on the bottom shower head 140. In the illustrated embodiment, the porous substrate 145 is elevated from the bottom shower head 140 by spacer elements 143. The spacer elements may comprise, for example ceramic beads or cylinders. The spacer elements 143 physically space the porous substrate from the shower head 140. In one embodiment, the spacer elements may be intergral with the bottom shower head 140. In alternative embodiment, the spacer elements 143 may be separate components from the bottom shower head 140. For applications where the porous substrate 145 has a different size and/or shape from one or both of the bottom shower head 140 and the upper shower head 130.

Figure 19A:
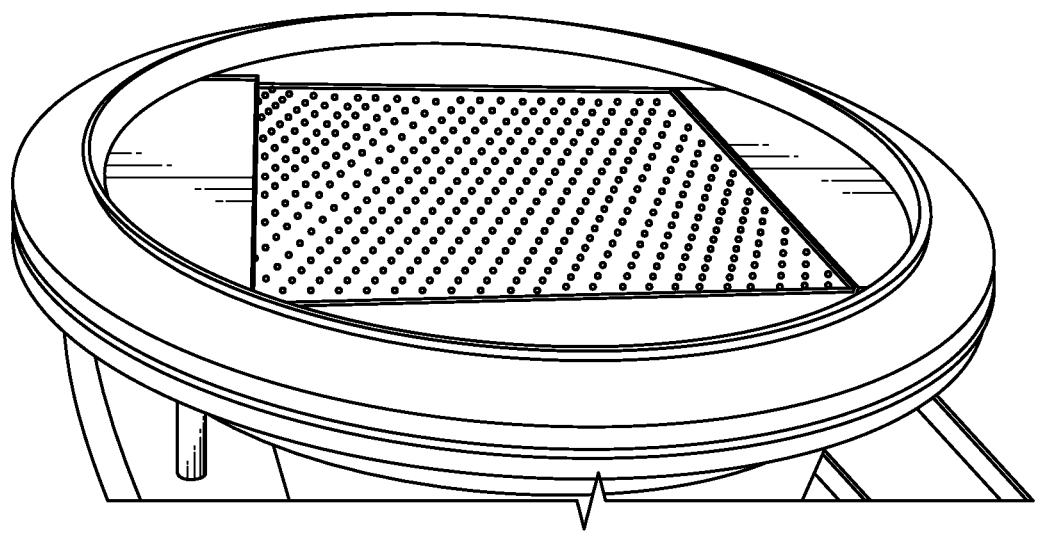
FIGS. 19A-B illustrate one embodiment of a 8"×8" porous capillary glass array substrate (MCP) placement with side pieces of similar porous substrate inside the dual showerhead ALD reaction chamber (monitor silicon pieces are positioned below the MCP)

Any void or leak around the porous substrate 145 can result in non-uniformity in the film deposited on or near the porous substrate. In an alternative embodiment shown in FIGS. 19A-B, the porous substrate 145 may be placed inside the reactor 120 with side pieces 147 of the same porous substrate material selected so as to essentially fill the cross-sectional area of the reactor with the porous substrate material. In other words, the substrate, combined with the side pieces 147, should have the same size and shape as the showerheads 130 and 140. The side pieces 147 can be comprised of the same material as the substrate, or of a different porous material having the same surface area and conductance. That is to say that the side pieces 147 should consume the precursors at the same rate as the substrate, but also maintain the same gas flow as the substrate. The silicon monitor is placed below the plane of the porous substrate 145.

Figure 20A:
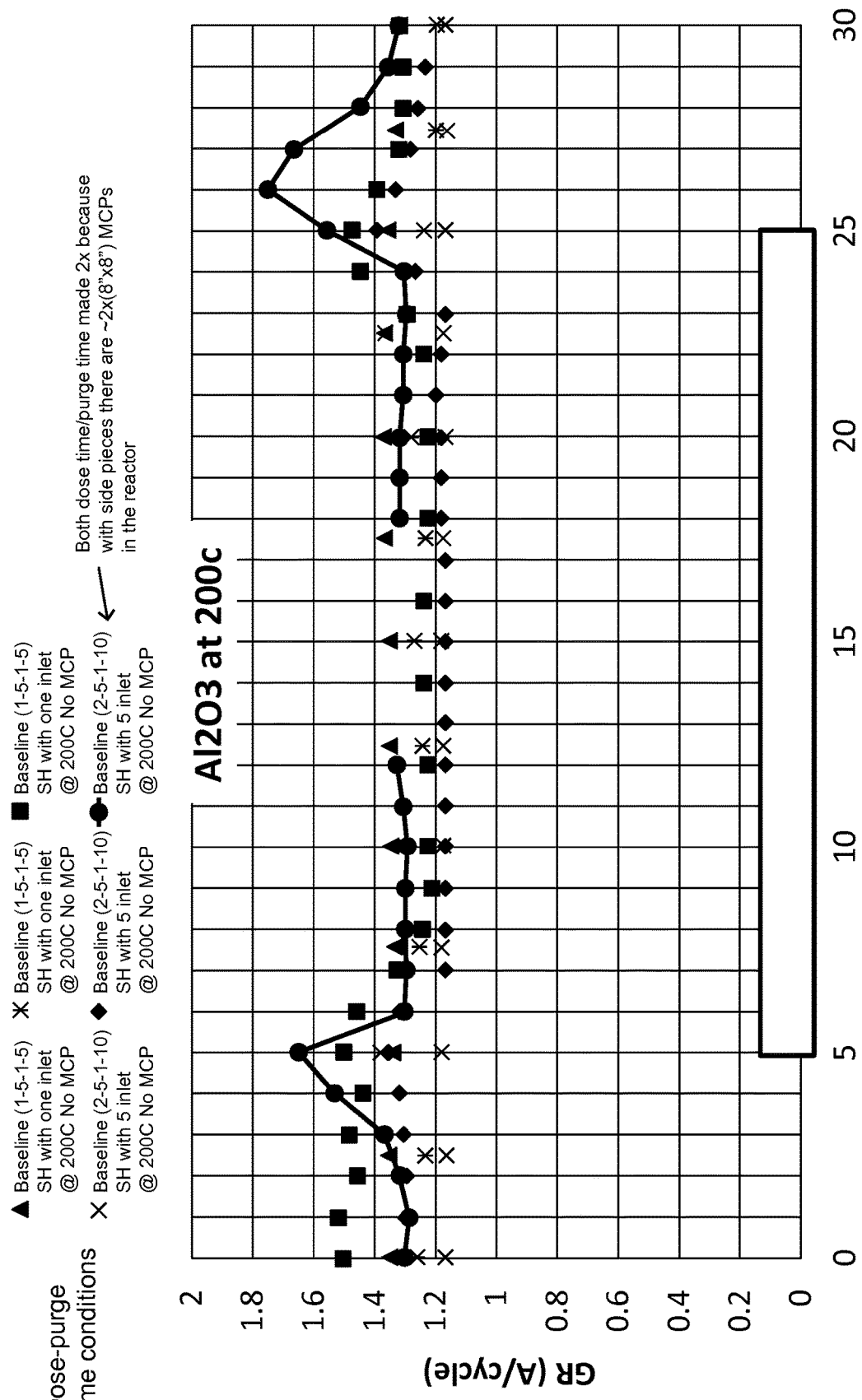
FIG. 20A Growth rate of $Al_2O_3$ with and without side pieces of MCP in the dual showerhead ALD reaction chamber during coating of 8"×8" MCP for different reaction chamber configurations.

FIG. 20A illustrates the growth rate (in Angstrom per cycle) under a number of conditions (see legend). FIG. 20A illustrates GR data with and without side pieces 147. For the embodiment using side pieces 147, effectively a 300 mm round MCP is presented which comprises a 8"×8" square MCP surrounded with arc-shaped pieces of MCP which make in total an MCP size of 300 mm diameter. In the graph the this data point is marked in circle and 300 mm MCP.

Figure 19B:
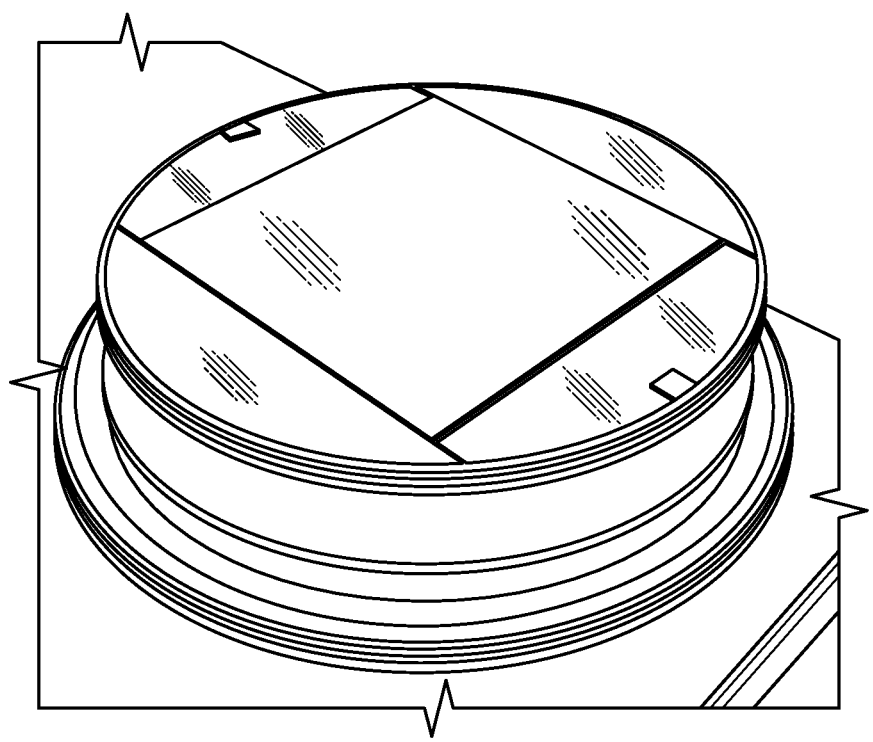
Figure 20B:
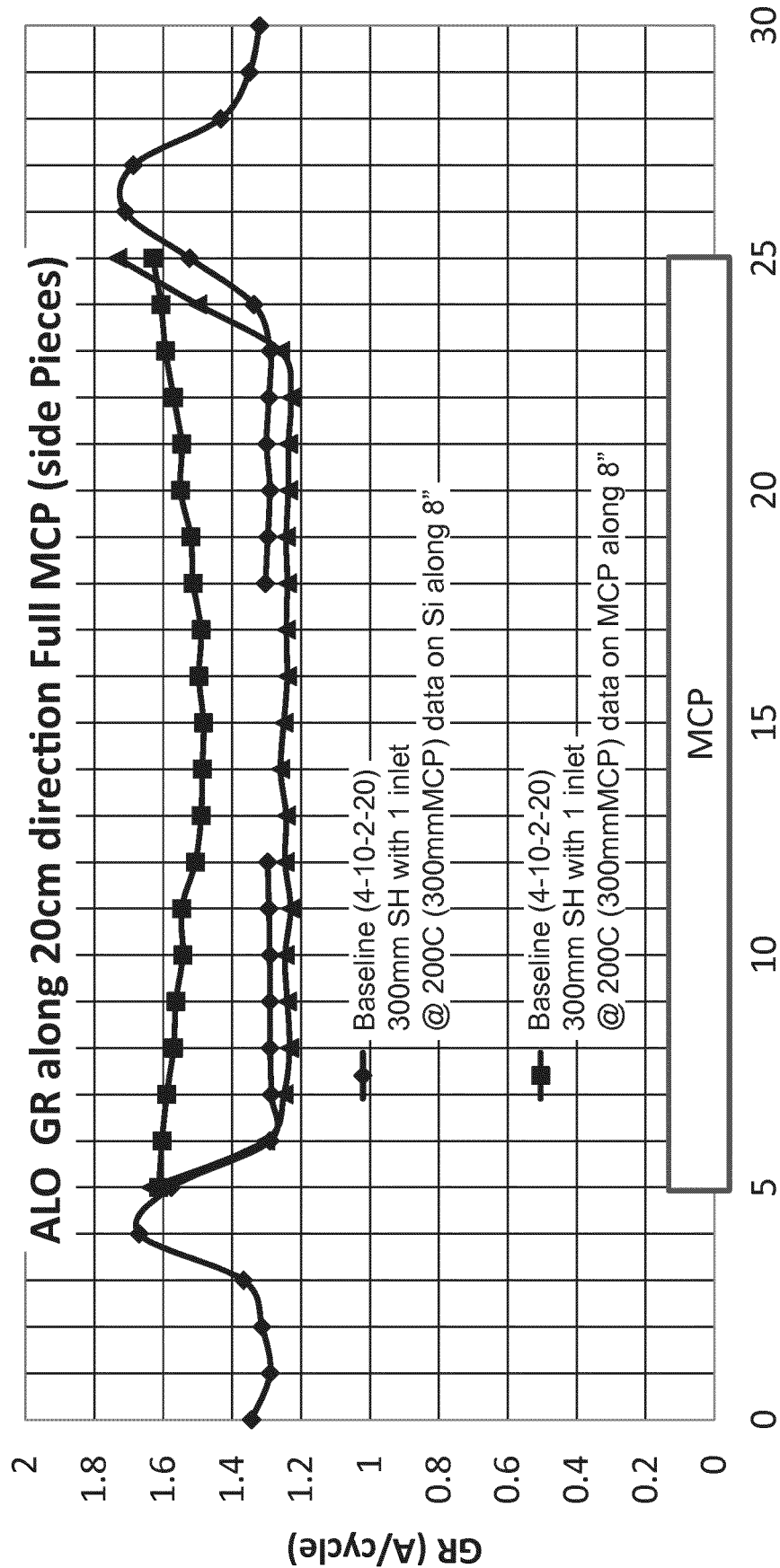
FIG. 20B Growth rate of $Al_2O_3$ with side pieces of similar MCP in the dual showerhead ALD reaction chamber.
Figure 20C:
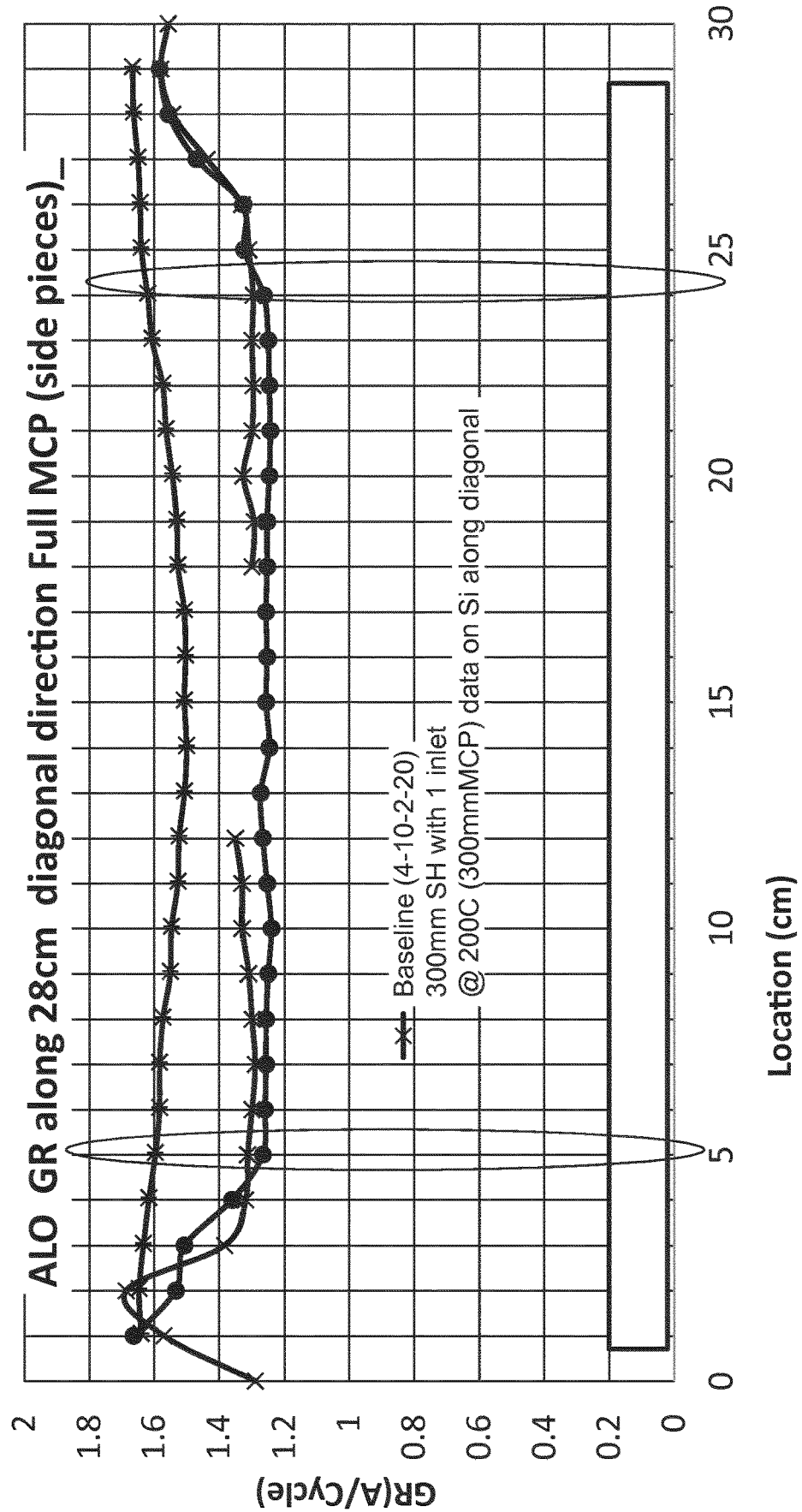
FIG. 20C illustrates measurement of the growth rate of $Al_2O_3$ along the diagonal of the 8"×8" MCP with side pieces of similar type of MCP in the dual showerhead ALD reaction chamber.

The ALD $Al_2O_3$ growth rate is higher at the edge of the porous substrate 145. In order to reduce the growth rate disparity, side pieces 147 of porous substrate were added. Preferably the gap between the side pieces 147 and the MCP is minimized, for example less than about 0.1 mm. In one embodiment, this gap is minimized by making exact size cut pieces with the edges polished so as to minimize the gap. FIGS. 20b-c illustrate the growth rate with side pieces 147. The measurements across the diagonal of FIG. 19b is show in FIG. 20c. As can be seen in FIG. 20c, the extra growth rate is not observed at the 5 and 25 cm locations but rather is associated with the edge between the porous substrate plate and the side pieces 147.

Figure 21:
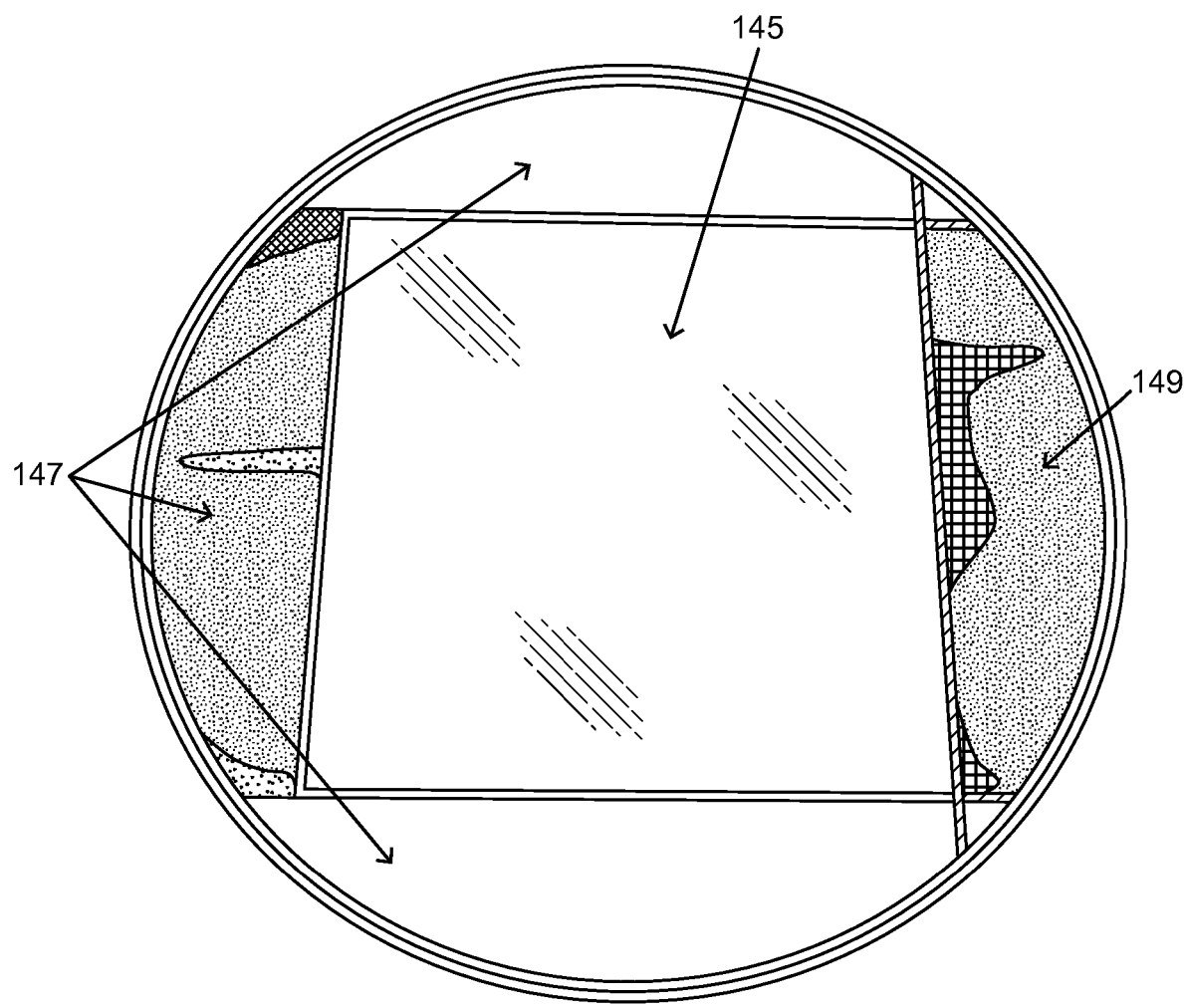
FIG. 21 illustrates a 8"×8" porous capillary glass array substrate (MCP) with side pieces of similar type of MCP cut to surround the 8"×8" MCP. One border of the 8"×8" MCP is sealed with kapton tape to the adjacent side piece.

FIG. 21 illustrates a further embodiment where the border between the porous substrate plate and the side pieces 147 is sealed. In the illustrated embodiment, one side is sealed using tape 149. The seal indicates the advantage of minimizing the gap.

Figure 22:
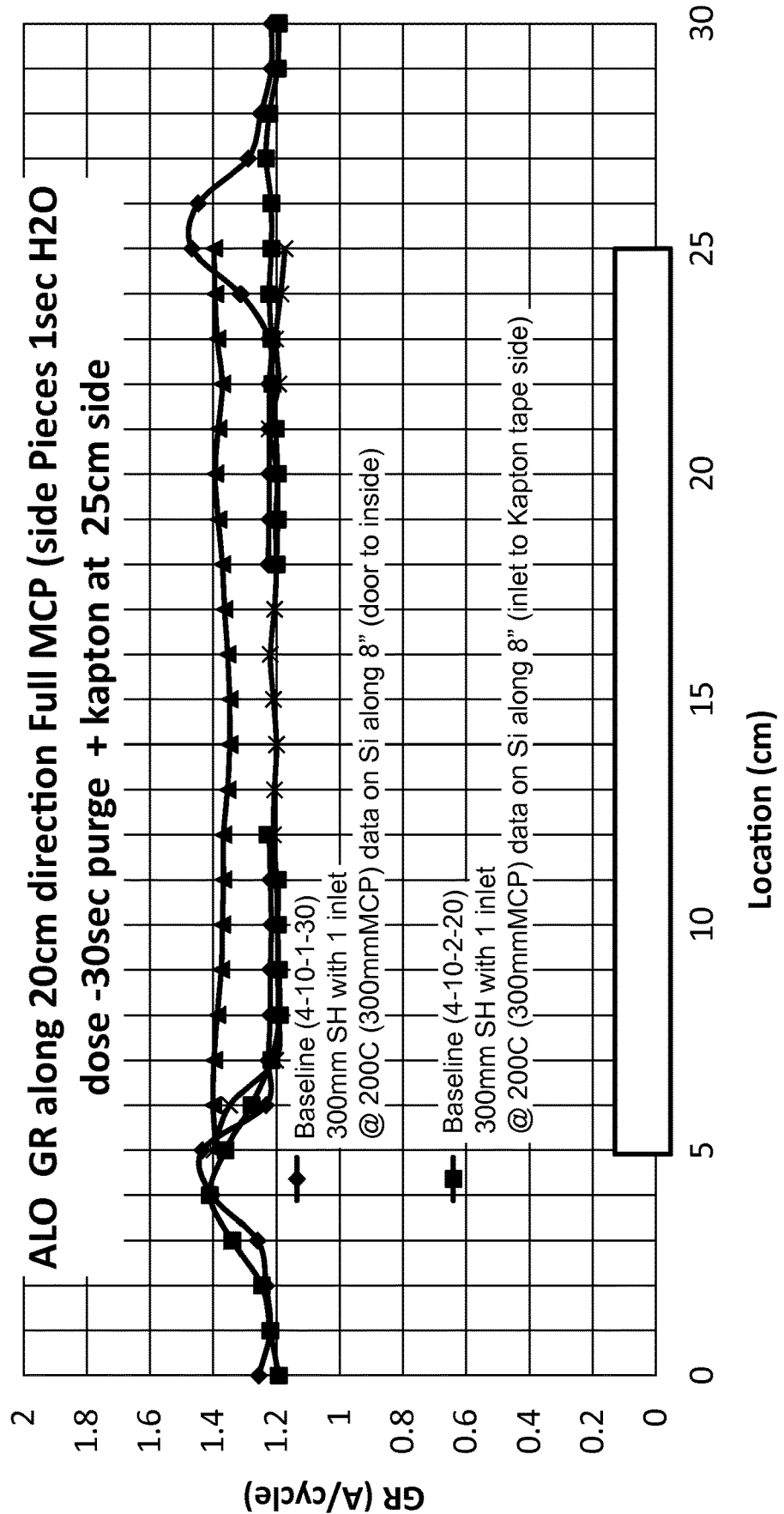
FIG. 22 illustrates growth rate of $Al_2O_3$ with side pieces of similar MCP in the dual showerhead ALD reaction chamber configured as in FIG. 21.

For example, in one embodiment a polyimide film, such as Kapton™ (poly(4,4'-oxydiphenylene-pyromellitimide) can be utilized. Where a seal is provided between the porous substrate 145 and the side pieces 147, appreciable additional growth rate was not observed. FIG. 22 is a growth rate graph indicating the relative growth rates of baseline samples and a sample with poly(4,4'-oxydiphenylene-pyromellitimide tape applied at the 25 cm border of the porous substrate and adjacent side piece. When the MCP gap is sealed with Kapton™ tape at one edge of the MCP, there was no thickness bump. All three other sides shows thickness bump, i.e. increased growth rate.

In one embodiment, there may be overlap between the MCP plate and the side pieces 147. For example, the MCP plate may be placed on top of the side pieces 147 such that there is about 1-2 mm overlap at the edges of the MCP plate.

The foregoing description of embodiments of the present invention has been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

What is claimed is:

1. A system for atomic layer deposition, comprising:
   a chamber for holding a substrate;
   an inlet for gas into the chamber;
   a top showerhead plate having a plurality of holes;
   a bottom showerhead plate having a plurality of holes and having a plurality of spacers extending from the bottom showerhead towards the top shower head, the bottom showerhead plate and the top showerhead plate separated by the plurality of spacers;
   the top showerhead plate and the bottom showerhead plate positioned against an inside wall of the chamber to prevent flow-by of the gas;
   ceramic supports positioned on the bottom shower plate between the top showerhead plate and the bottom showerhead plate, the substrate positioned on the ceramic supports;
   one or more side pieces positioned about the substrate and having pores wherein the one or more side pieces and the substrate extending to fill a cross-sectional area of the chamber between the top showerhead and the bottom showerhead; and
   an outlet for gas from the chamber.

2. The system as defined in claim 1 wherein the substrate comprises a porous substrate including a microchannel or microcapillary plate.

3. The system of claim 2, wherein the one or more side pieces are sealed to the porous substrate.

4. The system as defined in claim 1 wherein the ceramic supports support a plurality of substrates.

5. The system as defined in claim 1 wherein the chamber includes a conical section adjacent the outlet.

6. The system as defined in claim 1, wherein each of the plurality of holes of the top shower head plate are selected to be larger than the mean free path of the carrier gas to ensure viscous flow through the pores.

7. The system as defined in claim 1 wherein the spacing between adjacent ones of the plurality of holes (L) of the top shower head plate is selected to be several times smaller than the average lateral diffusion length for a gas used with the system.

8. The system as defined in claim 1 wherein the substrate comprises a porous substrate including a plurality of holes with aspect ratio greater than about 10-1000.

9. The system for atomic layer deposition of claim 1 wherein the top showerhead plate plurality of holes have a smaller diameter than the bottom showerhead plate plurality of holes.

10. The system of claim 1, wherein the inlet is coupled to the top showerhead plate and coupled to the bottom showerhead plate and further wherein the outlet is coupled to the top showerhead plate and coupled to the bottom showerhead plate.

11. The system of claim 1, wherein each of the one or more side pieces and the substrate are separated by a gap of no more than 0.1 mm.

12. The system of claim 1, wherein the one or more side pieces and the substrate having the same surface area and conductance.

13. A system for atomic layer deposition, comprising:
    a reactor having a top showerhead plate associated with a top showerhead plate inlet and configured to receive gas from the top showerhead plate inlet, the top showerhead plate having a plurality of holes;
    the reactor further including a bottom showerhead plate spaced apart from the top shower head plate by a plurality of spacers, the bottom showerhead plate having a plurality of holes and in communication with a bottom showerhead plate outlet, the reactor having a chamber defined between the top showerhead plate and the bottom showerhead plate;
    the top showerhead plate further is in communication with a top showerhead plate outlet for exhausting gas from the chamber;
    the bottom showerhead plate further is associated with a bottom showerhead plate inlet and configured to receive gas from the top showerhead plate outlet;
    the chamber configured to hold a porous substrate having substrate pores and a plurality of side pieces having side piece pores wherein the substrate pores and the plurality of sidepieces' pores are parallel with the top shower plate plurality of holes and the bottom shower plate plurality of holes; and
    the substrate and the plurality of side pieces together having the same size and shape as the top showerhead and the bottom showerhead.

14. The system of claim 13, wherein the one or more side pieces are sealed to the porous substrate.

* * * * *